United States Patent
Koshikawa

[11] Patent Number: 6,023,433
[45] Date of Patent: Feb. 8, 2000

[54] SEMICONDUCTOR MEMORY DEVICE WITH A REDUNDANT DECODER HAVING A SMALL SCALE IN CIRCUITRY

[75] Inventor: Yasuji Koshikawa, Tokyo, Japan

[73] Assignee: NEC Corporation, Tokyo, Japan

[21] Appl. No.: 09/182,514

[22] Filed: Oct. 30, 1998

[30] Foreign Application Priority Data

Oct. 30, 1997 [JP] Japan ................................ 9-298649

[51] Int. Cl.⁷ ...................................... G11C 29/00
[52] U.S. Cl. ................ 365/200; 365/225.7; 365/230.06; 365/230.03; 365/185.09
[58] Field of Search ................................ 365/200, 225.7, 365/230.03, 230.06, 185.09, 230.01

[56] References Cited

U.S. PATENT DOCUMENTS

| | | | |
|---|---|---|---|
| 5,519,657 | 5/1996 | Arimoto | 365/200 |
| 5,544,106 | 8/1996 | Koike | 365/200 |
| 5,602,778 | 2/1997 | Futatsuya et al. | 365/185.09 |
| 5,612,917 | 3/1997 | Kozawa et al. | 365/200 |
| 5,612,918 | 3/1997 | McClure | 365/200 |
| 5,689,465 | 11/1997 | Sukegawa et al. | 365/200 |
| 5,771,195 | 6/1998 | McCLure | 365/200 |
| 5,781,486 | 7/1998 | Merritt | 365/201 |
| 5,790,462 | 8/1998 | McClure | 365/200 |

FOREIGN PATENT DOCUMENTS 7-226100  8/1995  Japan.

*Primary Examiner*—Viet Q. Nguyen
*Attorney, Agent, or Firm*—Foley & Lardner

[57] ABSTRACT

In a semiconductor memory device comprising a regular memory cell array, a regular decoder, a redundant memory cell array, and a redundant decoder, the redundant decoder comprises a plurality of redundant decoding circuits each of which is supplied with a test mode signal. The redundant decoding circuits are supplied with an address signal and a complementary address signal in different order so that at least one pair of a bit in the address signal and a corresponding bit in the complementary address signal is supplied in the reverse sequence. The redundant decoder further comprises a decode inhibit signal producing arrangement for producing a decode inhibit signal indicative of active when any one of the redundant decoding circuits produces a redundant decoded signal indicative of active. Responsive to the decode inhibit signal indicative of inactive, the regular decoder decodes the address signal and the complementary address signal into a regular decoded signal for activating one of regular memory cells in the regular memory cell array. Each redundant decoding circuit comprises a test fuse circuit including a test fuse-element. The test fuse circuit produces a test fuse output signal indicative of active when the test fuse-element is not fused.

105 Claims, 14 Drawing Sheets

SEMICONDUCTOR MEMORY DEVICE WITH A REDUNDANT DECODER HAVING A SMALL SCALE IN CIRCUITRY

BACKGROUND OF THE INVENTION:

This invention relates to a semiconductor memory device and, in particular, to a semiconductor memory device comprising a regular memory cell array which comprises a plurality of regular memory cells and a redundant memory cell array which comprises a plurality of redundant memory cells for being substituted for defective regular memory cells where defects occur therein.

As is well known in the art, the semiconductor memory device of the type described comprises not only a regular memory cell array but also a redundant memory cell array serving as a spare memory cell array in order to improve yield on manufacture.

The regular memory cell array comprises a plurality of regular memory cells which are arranged in the configuration of a matrix with M rows and N columns where M and N represent first and second positive integers each of which is not less than two. That is, the regular memory cell array comprises first through M-th rows each of which consists of N regular memory cells arranged along a column direction. In other words, the regular memory cell array comprises first through N-th columns each of which consists of M regular memory cells arranged along a row direction.

Similarly, the redundant memory cell array comprises a plurality of redundant memory cells which are arranged in the configuration of a matrix with P rows and N columns where P represents a third positive integer which is not less than two. That is, the redundant memory cell array comprises first through P-th rows each of which consists of N redundant memory cells arranged along a column direction. In other words, the redundant memory cell array comprises first through N-th columns each of which consists of P redundant memory cells arranged along a row direction. The redundant memory cell array may comprise a plurality of redundant memory cells which are arranged in the configuration of a matrix with M rows and P columns.

Before shipment of the semiconductor memory device, at least one of the first through the P-th rows of the redundant memory cell array is substituted for one of the first through the M-th rows of the regular memory cell array that is diagnosed as a defective part or row by a test and results in making the whole semiconductor memory device an acceptable product. The defective part or row of the regular memory cell array includes at least one defective regular memory cell. On the other hand, remaining rows other than the defective row are called acceptable rows each of which includes no defective regular memory cell.

Replacement of the defective row of the regular memory cell array with an acceptable row of the redundancy memory cell array is carried out by setting an address for the defective row of the regular memory cell array in a redundant decoder for the acceptable row of the redundancy memory cell by trimming fuse-elements in the redundant decoder. The redundant decoder puts the acceptable row of the redundancy memory cell array into an operating state when the redundant decoder is supplied with a predetermined address signal.

Description will proceed to a known replacement method of replacing the defective row of the regular memory cell array with the acceptable row of the redundant memory cell array. A test in the regular memory cell array for defects is carried out. When any defect is not detected in the regular memory cell array, it is made a judgment that the semiconductor memory device is an acceptable product. It will be assumed that any defect is detected in a regular memory cell in a row of the regular memory cell array as the defective row. In this event, trimming of fuse-elements in a redundant decoder for a particular row of the redundancy memory cell array is carried out to replace the defective row of the regular memory cell array with the particular row of the redundant memory cell array. After replacement of the defective row of the regular memory cell array with the particular row of the redundant memory cell array, a test in the particular row of the redundant memory cell array for defects is carried out. If any defect is detected in the particular row of the redundant memory cell array, it is made a judgment that the semiconductor memory device is a defective product. If no defect is detected in the particular row of the redundant memory cell array, it is made a judgment that the semiconductor memory device is the acceptable product.

Inasmuch as the known semiconductor memory device does not return to the former state once the trimming of the fuse-elements is carried out, it is impossible to carry out a test of the particular row of the redundant memory cell array before replacement. Nevertheless, a defect hardly occurs in the particular row of the redundant memory cell array after replacement in a case where the rows of the redundant memory cell array is few, namely, the third positive integer P is small. However, with more and more improved to make semiconductor memory devices have a larger storage capacity in recent years, the rows of the redundancy memory cell arrays increase, namely, the third positive integer P is large. As a result, a case where the replaced row of the redundant memory cell array is defective occurs. Under the circumstances, the semiconductor memory device becomes a defective product although other acceptable rows of the redundant memory cell array remain. For example, when it is diagnosed that the replaced row of the redundant memory cell array is defective after replacement, it is judged that the whole semiconductor memory device is the defective product.

A method of resolving such a problem is disclosed in Japanese Unexamined Patent Publication of Tokkai No. Hei 7-226,100, namely, JP-A 7-226,100. In the semiconductor memory device according to JP-A 7-226,100, a redundant decoder generates a decode inhibit signal for inactivating a regular decoder for a regular memory cell array when a test mode signal is supplied to the redundant decoder. On the other hand, by previously corresponding an external address signal to an address of a redundant memory cell array as 1:1 and specifying an external address signal at the time of a test mode, the redundant decoder supplies the redundant memory cell array with a redundant decoded signal to activate the redundant memory cell array. Accordingly, access to a redundant memory cell is performed, thereby, test of the redundant memory cell can be preformed before operation of replacing a defective memory cell with the redundant memory cell.

In the manner which will later be described in conjunction with FIGS. 4 through 6, the conventional semiconductor memory device according to JP-A 7-226,100 is however disadvantageous in that it has a large scale in circuitry in a case where application is made about the semiconductor memory device comprising the redundant memory cell array including a lot of rows or a lot of redundant memory cells. This is because the conventional semiconductor memory device must comprise the redundant decoder provided with an address decoding circuit for selecting one of a lot of redundant decoding circuits.

SUMMARY OF THE INVENTION

It is therefore an object of the present invention to provide a semiconductor memory device, which has a small scale in circuitry although the semiconductor memory device comprises a redundant memory cell array including a lot of redundant memory cells.

It is another object of the present invention to provide a semiconductor memory device of the type described, which is capable of carrying out a test of the redundant memory cell array before replacement.

Other objects of this invention will become clear as the description proceeds.

According to an aspect of this invention, a semiconductor memory device comprises a regular memory cell array comprising a plurality of regular memory cells which are arranged in the configuration of a matrix with first through M-th rows and first through N-th columns where M and N represent first and second positive integers each of which is not less than two. Connected to the regular memory cell array and supplied with a decode inhibit signal, an address signal, and a complementary address signal having a logical value which is reverse of that of the address signal, a regular decoder decodes the address signal and the complementary address signal into a regular decoded signal for activating one of the regular memory cells when the decode inhibit signal is indicative of inactive. A redundant memory cell array comprises a plurality of redundant memory cells which are arranged in the configuration of a matrix with first through P-th rows and the first through the N-th columns where P represents a third positive integer which is not less than two. Each of the first through the P-th rows of the redundant memory cell array carries out a substitute operation by replacing a defective one of the first through the M-th rows of the regular memory cell array that is diagnosed as a defective row. Connected to the redundant memory cell array and the regular decoder and supplied with a test mode signal, a redundant decoder comprises first through P-th redundant decoding circuits connected to the first through the P-th rows of the redundant memory cell array, respectively. Each of the first through the P-th redundant decoding circuits is supplied with a row address in the address signal, a complementary row address in the complementary address signal, and the test mode signal. A p-th redundant decoding circuit is set with a p-th redundant row address which is identical with an address for the defective row of the regular memory cell array, where p represents each of 1 through P. The p-th redundant decoding circuit supplies a p-th row of the redundant memory cell array with a p-th redundant decoded signal for activating the p-th row of the redundant memory cell array when the p-th redundant decoding circuit is supplied with the row address and the complementary row address which are indicative of the p-th redundant row address. The first through the P-th redundant decoding circuits are supplied with the row address of the address signal and the complementary row address of the complementary address signal in different order so that at least one pair of a bit in the row address and a corresponding bit in the complementary row address is supplied in the reverse sequence. The redundant decoder further comprises a decode inhibit signal producing means, connected between the first through the P-th redundant decoding circuits and the regular decoder, for producing the decode inhibit signal indicative of active when any one of the first through the P-th redundant decoded signals is indicative of active.

According to another aspect of this invention, a semiconductor memory device comprises a regular memory cell array comprising a plurality of regular memory cells which are arranged in the configuration of a matrix with first through M-th rows and first through N-th columns where M and N represent first and second positive integers each of which is not less than two. Connected to the regular memory cell array and supplied with a decode inhibit signal, an address signal, and a complementary address signal having a logical value which is reverse of that of the address signal, a regular decoder decodes the address signal and the complementary address signal into a regular decoded signal for activating one of the regular memory cells when the decode inhibit signal is indicative of inactive. A redundant memory cell array comprises a plurality of redundant memory cells which are arranged in the configuration of a matrix with first through M-th rows and the first through the P-th columns where P represents a third positive integer which is not less than two. Each of the first through the P-th columns of said redundant memory cell array carries out a substitute operation by replacing a defective one of the first through the M-th columns of the regular memory cell array that is diagnosed as a defective column. Connected to the redundant memory cell array and the regular decoder and supplied with a test mode signal, a redundant decoder comprises first through P-th redundant decoding circuits connected to the first through the P-th rows of said redundant memory cell array, respectively. Each of the first through the P-th redundant decoding circuits is supplied with a column address in the address signal, a complementary column address in the complementary address signal, and the test mode signal. A p-th redundant decoding circuit is set with a p-th redundant column address which is identical with an address for the defective column of the regular memory cell array, where p represents each of 1 through P. The p-th redundant decoding circuit supplies a p-th column of the redundant memory cell array with a p-th redundant decoded signal for activating the p-th column of the redundant memory cell array when the p-th redundant decoding circuit is supplied with the column address and the complementary column address which are indicative of the p-th redundant column address. The first through the P-th redundant decoding circuits are supplied with the column address of the address signal and the complementary column address of the complementary address signal in different order so that at least one pair of a bit in the column address and a corresponding bit in the complementary column address is supplied in the reverse sequence. The redundant decoder further comprises a decode inhibit signal producing means, connected between the first through the P-th redundant decoding circuits and the regular decoder, for producing the decode inhibit signal indicative of active when any one of the first through the P-th redundant decoded signals is indicative of active.

According to still another aspect of this invention, a semiconductor memory device comprises a regular memory cell array comprising a plurality of regular memory cells. Connected to the regular memory cell array and supplied with decode inhibit signal, an address signal, and a complementary address signal having a logical value which is reverse of that of the address signal, a regular decoder decodes the address signal and the complementary address signal into a regular decoded signal for activating one of the regular memory cells when the decode inhibit signal is indicative of inactive. A redundant memory cell array comprises a plurality of redundant memory cells. Each of the redundant memory cells of the redundant memory cell array carries out a substitute operation by replacing a defective one of the regular memory cells of the regular memory cell array that is diagnosed as a defective memory cell. Connected to the redundant memory cell array and the regular decoder and supplied with a test mode signal, a redundant decoder comprises a plurality of redundant decoding circuits connected to the respective redundant memory cells of said redundant memory cell array. Each of the redundant decoding circuits is supplied with the address signal, the complementary address signal, and the test mode signal. Each redundant decoding circuit is set with a redundant address which is identical with an address for the defective memory cell of the regular memory cell array. Each redundant decoding circuit supplies a corresponding redundant memory cell of the redundant memory cell array with a redundant decoded signal for activating the corresponding redundant memory cell of the redundant memory cell array when the redundant decoding circuit is supplied with the address signal and the complementary address signal which are indicative of the redundant address for the redundant decoding circuit in question. The redundant decoding circuits are supplied with the address signal and the complementary address signal in different order so that at least one pair of a bit in the address signal and a corresponding bit in the complementary address signal is supplied in the reverse sequence. The redundant decoder further comprises a decode inhibit signal producing means, connected between the first through the P-th redundant decoding circuits and the regular decoder, for producing the decode inhibit signal indicative of active when any one of the redundant decoded signals is indicative of active.

DESCRIPTION OF THE PREFERRED EMBODIMENTS

Figure 1:
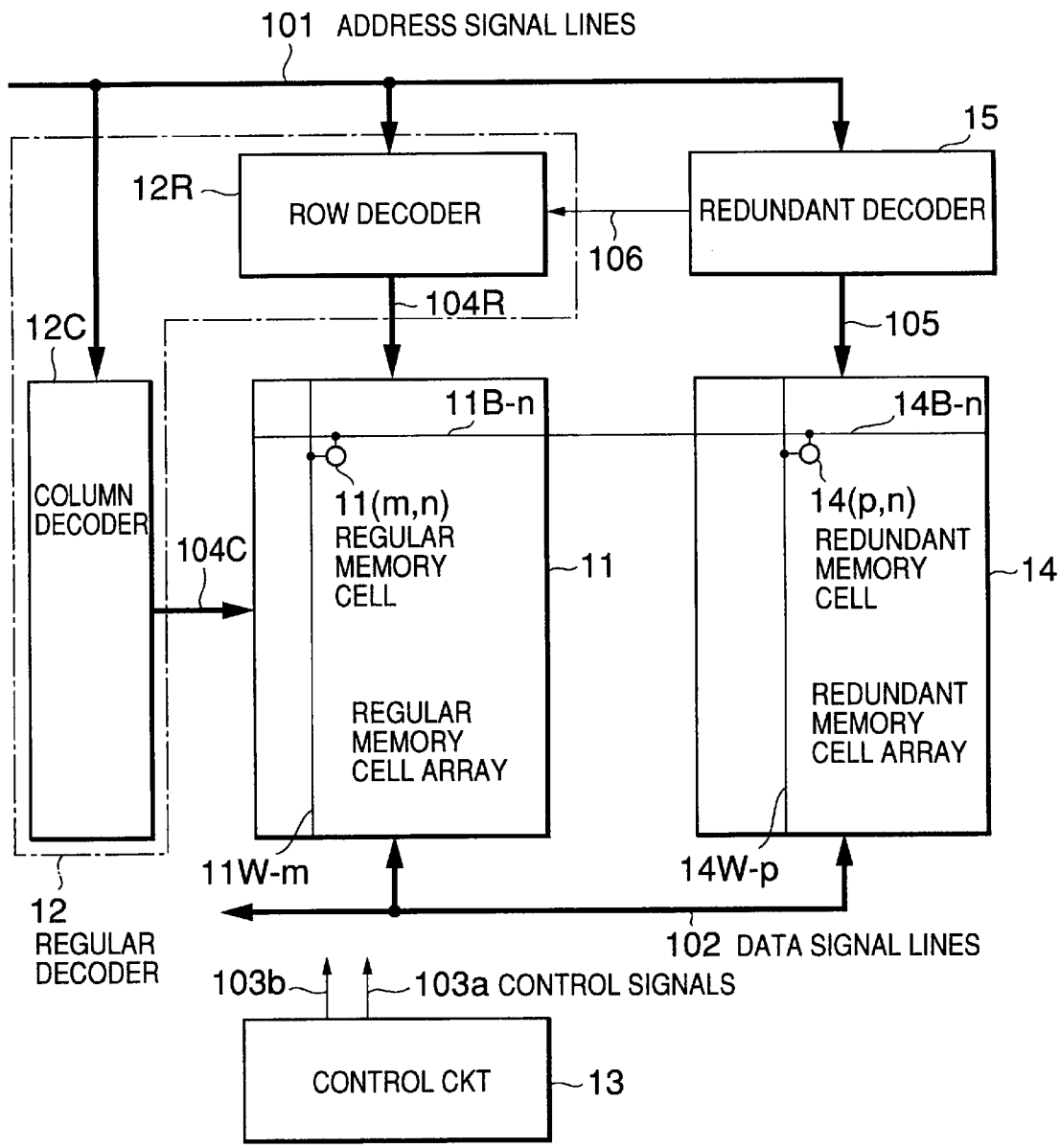
FIG. 1 is a block diagram of a known semiconductor memory device.
Figure 2:
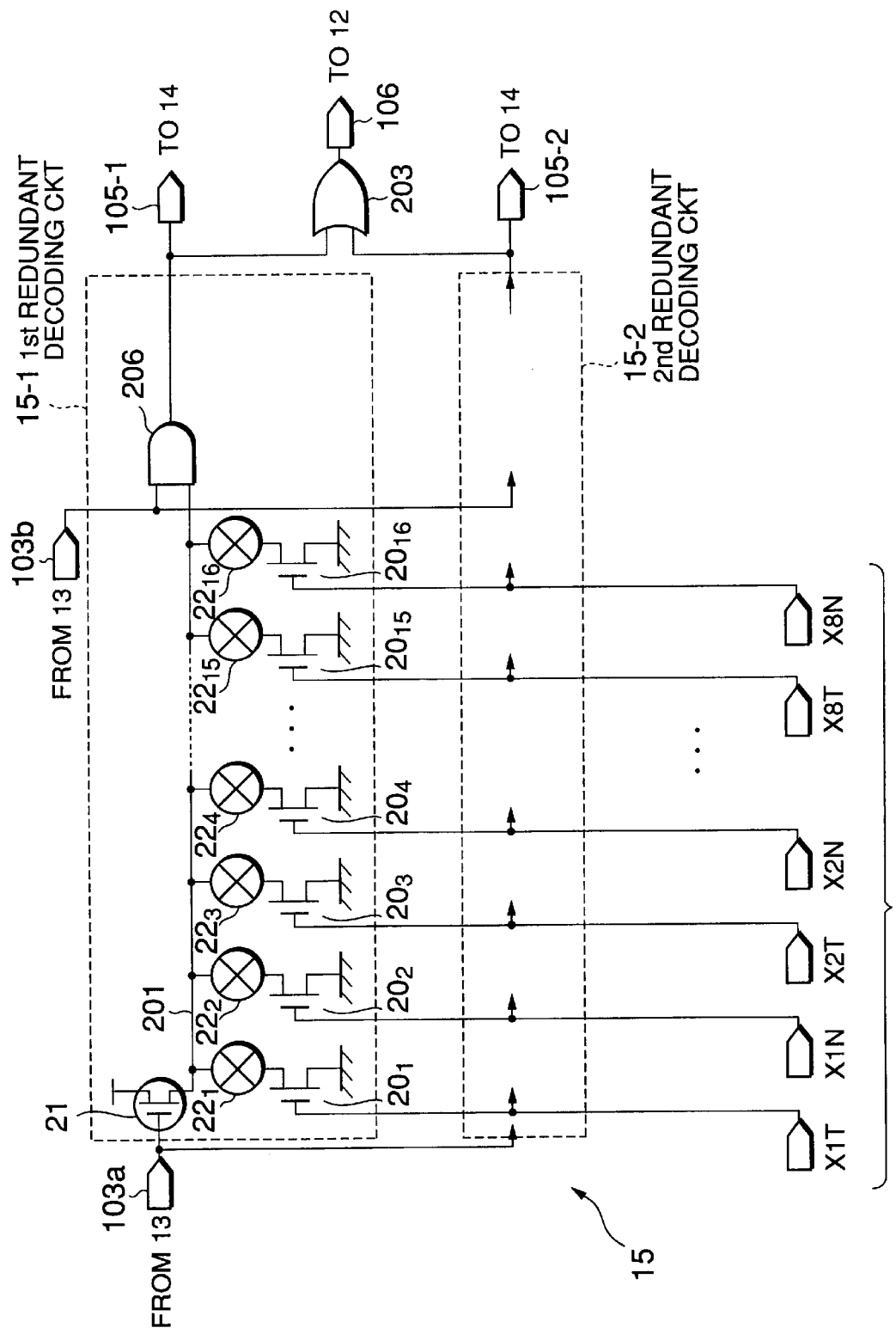
FIG. 2 is a circuit diagram of a known redundant decoder for use in the known semiconductor memory device illustrated in FIG. 1.
Figure 3:
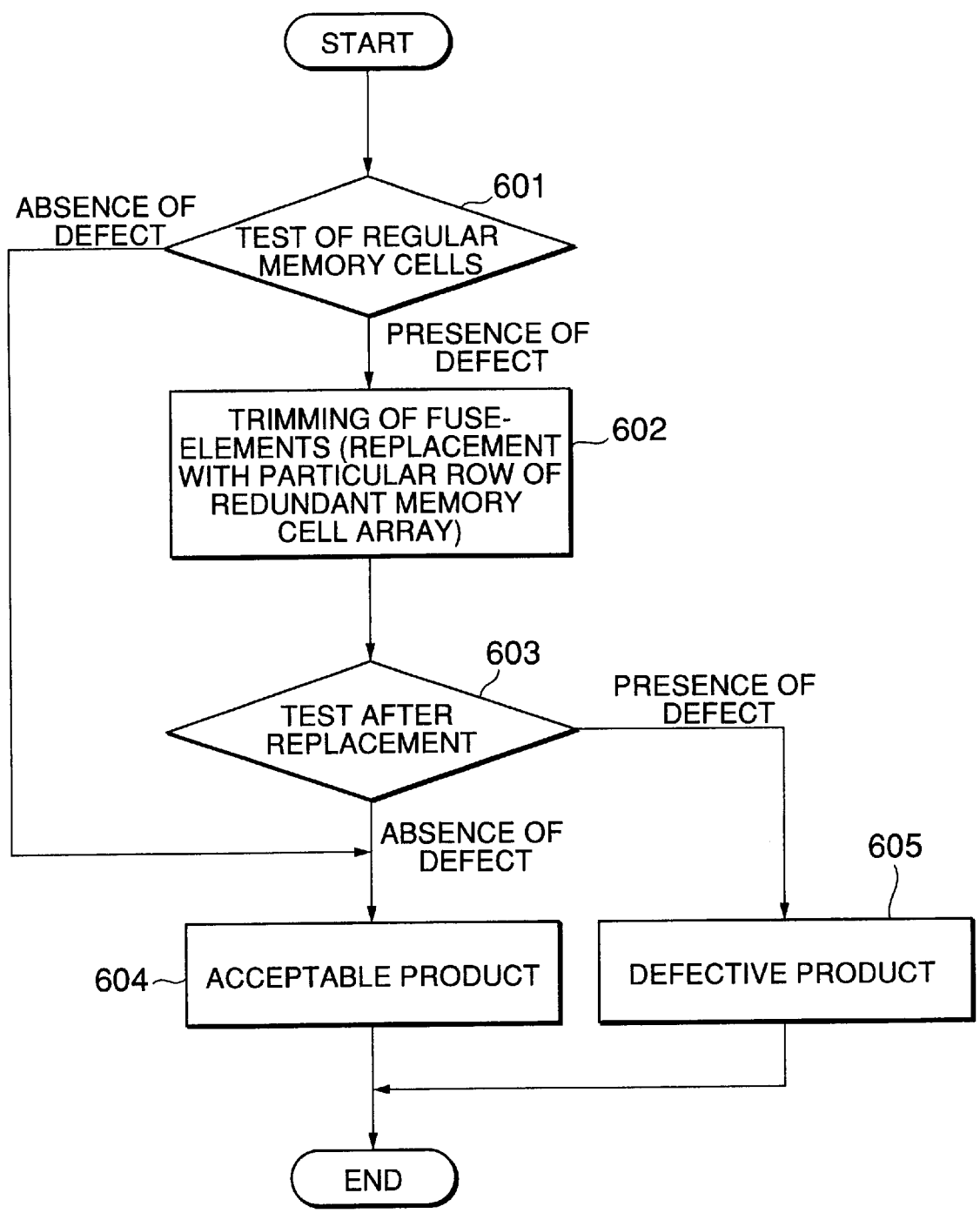
FIG. 3 is a flow chart for use in describing a known replacement method for replacing a defective row of a regular memory cell array with a particular row of a redundant memory cell array in the known semiconductor memory device illustrated in FIG. 1.

Referring to FIGS. 1 through 3, a known semiconductor memory device will be described at first in order to facilitate an understanding of the present invention. FIG. 1 is a block diagram of the known semiconductor memory device, FIG. 2 is a circuit diagram of a known redundant decoder for use in the known semiconductor device illustrated in FIG. 1, and FIG. 3 is a flow chart for use in describing a known replacement method for replacing a defective part or row of a regular memory cell array with a particular part or row of a redundant memory cell array in the known semiconductor memory device illustrated in FIG. 1.

As shown in FIG. 1, the known semiconductor memory device comprises a regular memory cell array 11, a regular decoder 12, a control circuit 13, a redundant memory cell array 14, and a redundant decoder 15.

The regular memory cell array 11 comprises a plurality of regular memory cells 11(m,n) which are arranged in the configuration of a matrix with M rows and N columns, where M and N represent first and second positive integers each of which is not less than two and where m represents each of 1 through M and n represents each of 1 through N. That is, the regular memory cell array 11 comprises first through M-th rows each of which consists of N regular memory cells arranged along a column direction. In other words, the regular memory cell array 11 comprises first through N-th columns each of which consists of M regular memory cells arranged along a row direction.

More specifically, the regular memory cell array 11 comprises first through M-th word lines each of which extends along the column direction and first through N-th bit lines each of which extends along the row direction. An m-th row and n-th column regular memory cell 11(m,n) is connected to an m-th word line 11W-m and an n-th bit line 11B-n, as shown in FIG. 1. The regular memory cell array 11 is connected to date signal lines 102.

The regular decoder 12 is connected to the regular memory cell array 11. The regular decoder 12 is supplied via address signal lines 101 with an address signal and a complementary address signal having a logical value which is reverse of that of the address signal. When a decode inhibit signal 106 is indicative of inactive, the regular decoder 12 decodes the address signal and the complementary address signal into a regular decoded signal which is supplied to the regular memory cell array 11.

As is well known in the art, the address signal indicates or is classified into a row address and a column address. In addition, the complementary address signal indicates or is classified into a complementary row address and a complementary column address. The regular decoder 12 comprises a row decoder 12R and a column decoder 12C. The row decoder 12R is supplied with the row address and the complementary row address. The row decoder 12R decodes the row address and the complementary row address into a row decoded signal 104R. Likewise, the column decoder 12C is supplied with the column address and the complementary column address. The column decoder 12C decodes the column address and the complementary column address into a column decoded signal 104C. The row decoded signal 104R is supplied to the first through the M-th word lines of the regular memory cell array 11 to activate one of the first through the M-th word lines. Similarly, the column decoded signal 104C is supplied to the first through the N-th bit lines of the regular memory cell array 11 to activate one of the first through the N-th bit lines.

Similarly, the redundant memory cell array 14 comprises a plurality of redundant memory cells 14(p,n) which are arranged in the configuration of a matrix with P rows and N columns, where P represents a third positive integer which is not less than two and where p represents each of 1 through P. That is, the redundant memory cell array 14 comprises first through P-th rows each of which consists of N redundant memory cells arranged along a column direction. In other words, the redundant memory cell array 14 comprises first through N-th columns each of which consists of P redundant memory cells arranged along a row direction.

More specifically, the redundant memory cell array 14 comprises first through P-th word lines each of which extends along the column direction and first through N-th bit lines each of which extends along the row direction. An p-th row and n-th column redundant memory cell 14(p,n) is connected to an p-th word line 14W-p and an n-th bit line 14B-n, as shown in FIG. 1. The n-th bit line 14B-n in the redundant memory cell array 14 is connected to the n-th bit line 11B-n in the regular memory cell array 11, as shown in FIG. 1. The redundant memory cell array 14 is also connected to the data signal lines 102.

Before shipment of the semiconductor memory device, at least one of the first through the P-th rows of the redundant memory cell array 14 is substituted for one of the first through the M-th rows of the regular memory cell array 11 that is diagnosed as a defective part or row by a test and results in making the whole semiconductor memory device an acceptable product. The defective part or row of the regular memory cell array 11 includes at least one defective regular memory cell. On the other hand, remaining rows other than the defective row are called acceptable rows each of which includes no defective regular memory cell.

The redundant decoder 15 is connected to the redundant memory cell array 14. The redundant decoder 15 is supplied via the address signal lines 101 with the address signal and the complementary address signal. In the manner which will later become clear, the redundant decoder 15 decodes the row address of the address signal and the complementary row address of the complementary address signal into a redundant decoded signal 105 and the decode inhibit signal 106 indicative of active. The redundant decoded signal 105 is supplied to the first through the P-th word lines of the redundant memory cell array 14 to activate one of the first through the P-th word lines. Accordingly, the redundant decoder 15 in the example being illustrated is called a spare row decoder.

Replacement of the defective row of the regular memory cell array 11 with an acceptable row of the redundancy memory cell array 14 is carried out by setting an address for the defective row of the regular memory cell array 11 in the redundant decoder 15 for the acceptable row of the redundancy memory cell array 14 by trimming fuse-elements in the redundant decoder 15 in the manner which will later become clear. The redundant decoder 15 puts the acceptable row of the redundancy memory cell array 14 into an operating state when the redundant decoder 15 is supplied with a predetermined address signal.

In the manner which will later become clear, the control circuit 13 produces first and second control signals 103a and 103b which are supplied to the redundant decoder 15.

As shown in FIG. 2, the redundant decoder 15 comprises first through P-th redundant decoding circuits 15-1 through 15-P which are connected to the first through the P-th rows of the redundant memory cell array 14, respectively. In the example being illustrated, the third positive integer P is equal to two. Accordingly, the redundant decoder 15 comprises the first and second redundant decoding circuits 15-1 and 15-2. Inasmuch as the second redundant decoding circuit 15-2 is similar in structure to the first redundant decoding circuit 15-1, structure of the second redundant decoding circuit 15-2 is omitted from drawing.

It will be assumed that the row address of the address signal is eight bits in length and consists of first through eighth bits X1T, X2T, . . . , and X8T. Likewise, the complementary row address of the complementary address signal is eight bits in length and consists of first through eighth complementary bits X1N, X2N, . . . , and X8N. In general, each of the row address and the complementary row address is Q bits in length where Q represents a fourth positive integer which is not less than two.

The first redundant decoding circuit 15-1 comprises first through sixteenth N-channel MOSFETs $20_1$, $20_2$, $20_3$, $20_4$, . . . , $20_{15}$, and $20_{16}$, a P-channel MOSFET 21, first through sixteenth fuse-elements $22_1$, $22_2$, $22_3$, $22_4$, . . . , $22_{15}$, and $22_{16}$, and an AND gate 206.

As is well known in the art, each MOSFET has primary and subsidiary main electrodes which are called drain and source electrodes, respectively, and a control electrode which is called a gate electrode.

The P-channel MOSFET 21 has a source electrode supplied with a high-level potential, a drain electrode connected to a common node 201, and a gate electrode supplied with the first control signal 103a from the control circuit 13 (FIG. 1). Each of the first through the sixteenth fuse-elements $22_1$ to $22_{16}$ has an end connected to the common node $20_1$. The first through the sixteenth fuse-elements $22_1$ to $22_{16}$ have other ends connected to drain electrodes of the first through the sixteen N-channel MOSFETs $20_1$ to $20_{16}$.

Each of the first through the sixteen N-channel MOSPETs $20_1$ to $20_{16}$ has a source electrode supplied with a grounding or low-level potential. The first, the third, . . . , and the fifteenth N-channel MOSFETs $20_1$, $20_3$, . . . , and $20_{15}$ have gate electrodes which are supplied with the first, the second, . . . , and the eighth bits X1T, X2T, . . . , and X8T in the row address of the address signal, respectively. The second, the fourth, . . . , and the sixteenth N-channel MOSFETs $20_2$, $20_4$, . . . , and $20_{16}$ have gate electrodes which are supplied with the first, the second, . . . , and the eighth complementary bits X1N, X2N, . . . , and X8N in the complementary row address of the complementary address signal, respectively.

The common node 201 is connected to one input terminal of the AND gate 206. The AND gate 206 has another input terminal supplied with the second control signal 103b from the control circuit 13 (FIG. 1). The first AND gate 206 produces a first redundant decoded signal 105-1 which is supplied to the first row of the redundant memory cell array 14 (FIG. 1).

Likewise, the second redundant decoding circuit 15-2 is supplied with the row address (X1T, X2T, . . . , X8T) of the address signal, the complementary row address (X1N, X2N, . . . , X8N) of the complementary address signal, the first and the second control signals 103a and 103b. The second redundant decoding circuit 15-2 produces a second redundant decoded signal 105-2 which is supplied to the second row of the redundant memory cell array 14 (FIG. 1).

The redundant decoder 15 further comprises an OR gate 203 which is supplied with the first and the second redundant decoded signals 105-1 and 105-2. The OR gate 203 computes the OR of the first and the second redundant decoded signals 105-1 and 105-2 to produce an ORed signal as the decode inhibit signal 106. That is, the OR gate 203 serves as a decode inhibit signal producing arrangement for producing the decode inhibit signal indicative of active when any one of the first and the second redundant decoded signals 105-1 and 105-2 is indicative of active.

Referring to FIG. 3, description will proceed to the known replacement method of replacing the defective row of the regular memory cell array 11 with the acceptable row of the redundant memory cell array 14. At first, a test in the regular memory cells 11(m,n) of the regular memory cell array 11 for defects is carried out at a step 601. When any defect is not detected in the regular memory cells 11(m,n) of the regular memory cell array 11, the step 601 is followed by a step 604 at which it is made a judgment that the semiconductor memory device is an acceptable product.

It will be assumed that any defect is detected in a regular memory cell in a row of the regular memory cell array 11 as the defective row. In this event, the step 601 proceeds to a step 602 at which trimming of the fuse-elements in the redundant decoder 15 for a particular row of the redundancy memory cell array 14 is carried out to replace the defective row of the regular memory cell array 11 with the particular row of the redundant memory cell array 14. After replacement of the defective row of the regular memory cell array 11 with the particular row of the redundant memory cell array 14, the step 602 is succeeded by a step 603 at which a test in the redundant memory cells 14(p,n) in the particular row of the redundant memory cell array 14 for defects is carried out. If any defect is detected in the redundant memory cells 14(p,n) in the particular row of the redundant memory cell array 14, the step 603 is followed by a step 605 at which it is made a judgment that the semiconductor memory device is a defective product. If no defect is detected in the redundant memory cells 14(p,n) in the particular row of the redundant memory cell array 14, the step 603 proceeds to the step 604 at which it is made a judgment that the semiconductor memory device is the acceptable product.

Inasmuch as the known semiconductor memory device does not return to the former state once the trimming of the fuse-elements is carried out, it is impossible to carry out a test in the redundant memory cells 14(p,n) in the particular row of the redundant memory cell array 14 before replacement. Nevertheless, a defect hardly occurs in the redundant memory cells 14(p,n) in the particular row of the redundant memory cell array 14 after replacement in a case where the rows of the redundant memory cell array 14 is few, namely, the third positive integer P is small. However, with more and more improved to make semiconductor memory devices have a larger storage capacity in recent years, the rows of the redundancy memory cell arrays 14 increase, namely, the third positive integer P is large. As a result, a case where the replaced row of the redundant memory cell array is defective occurs. Under the circumstances, the semiconductor memory device becomes a defective product although other acceptable rows of the redundant memory cell array remain. For example, in the flow chart of FIG. 3, when it is diagnosed that the replaced row of the redundant memory cell array 14 is defective after replacement at the step 603, it is judged that the whole semiconductor memory device is the defective product (step 605).

A method of resolving such a problem is disclosed in the above-mentioned Japanese Unexamined Patent Publication of Tokkai No. Nei 7-226,100, namely, JP-A 7-226,100.

Figure 4:
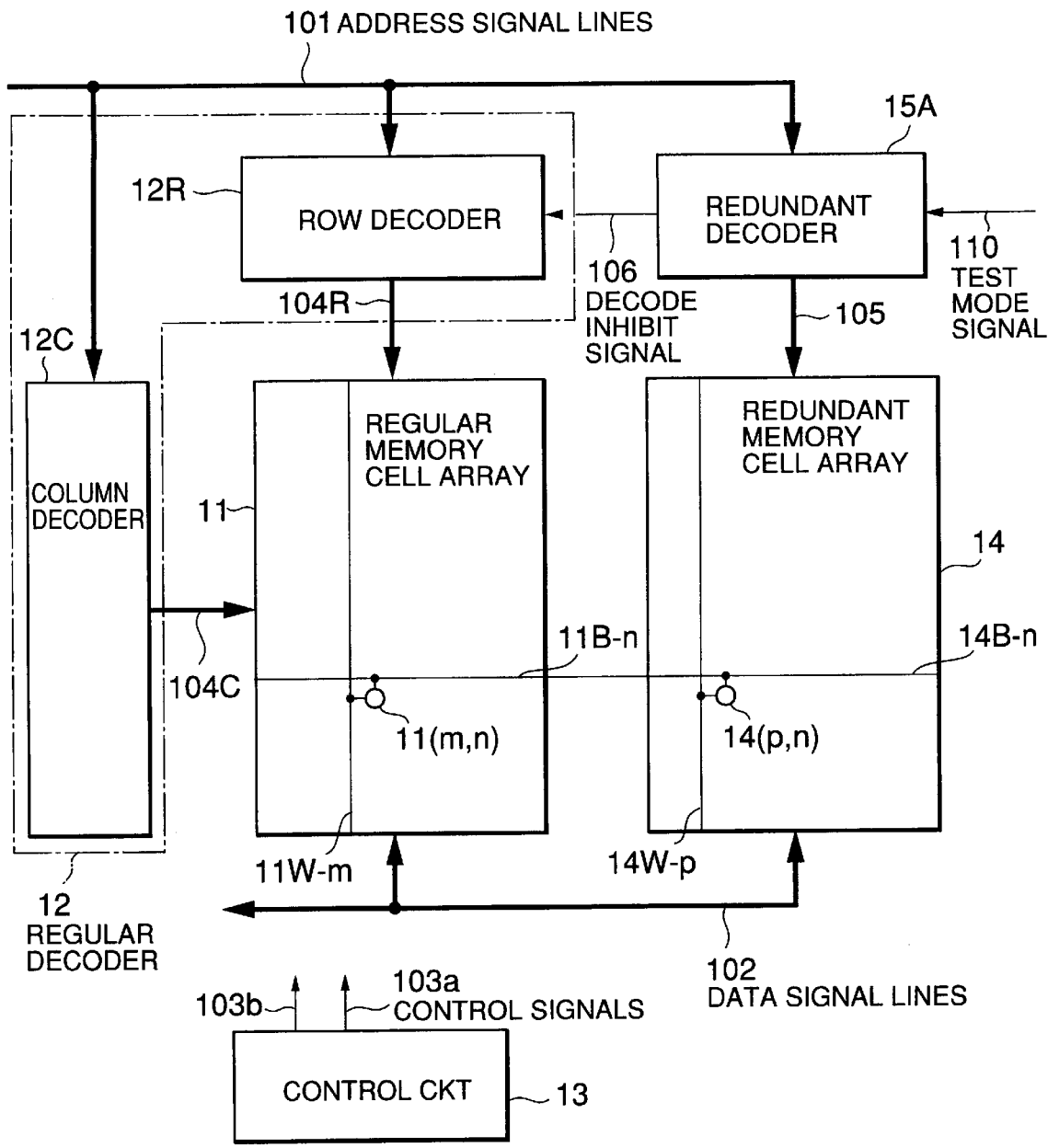
FIG. 4 is a block diagram of a conventional semiconductor memory device.
Figure 5:
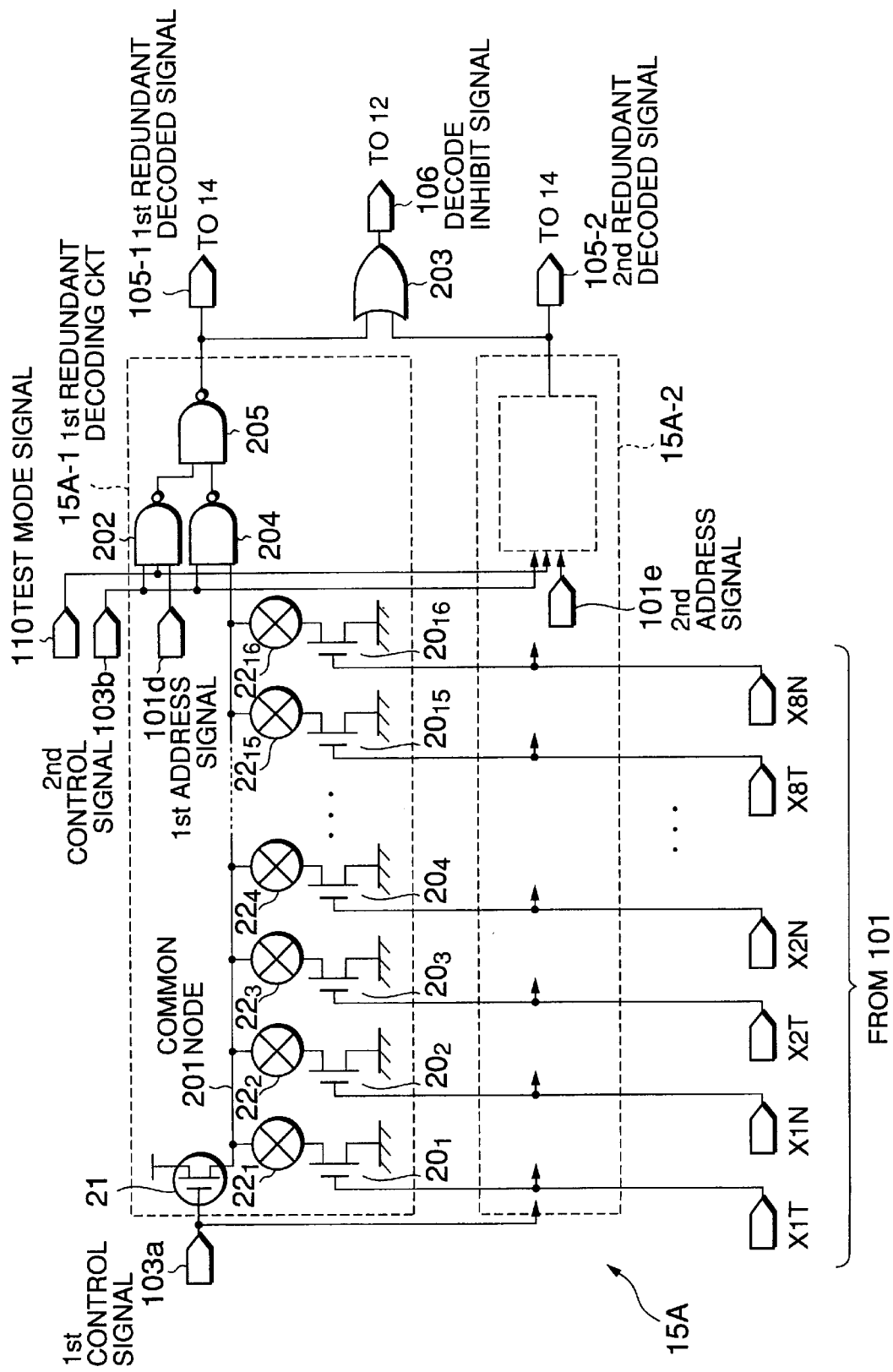
FIG. 5 is a circuit diagram of a conventional redundant decoder for use in the conventional semiconductor memory device illustrated in FIG. 4.
Figure 6:
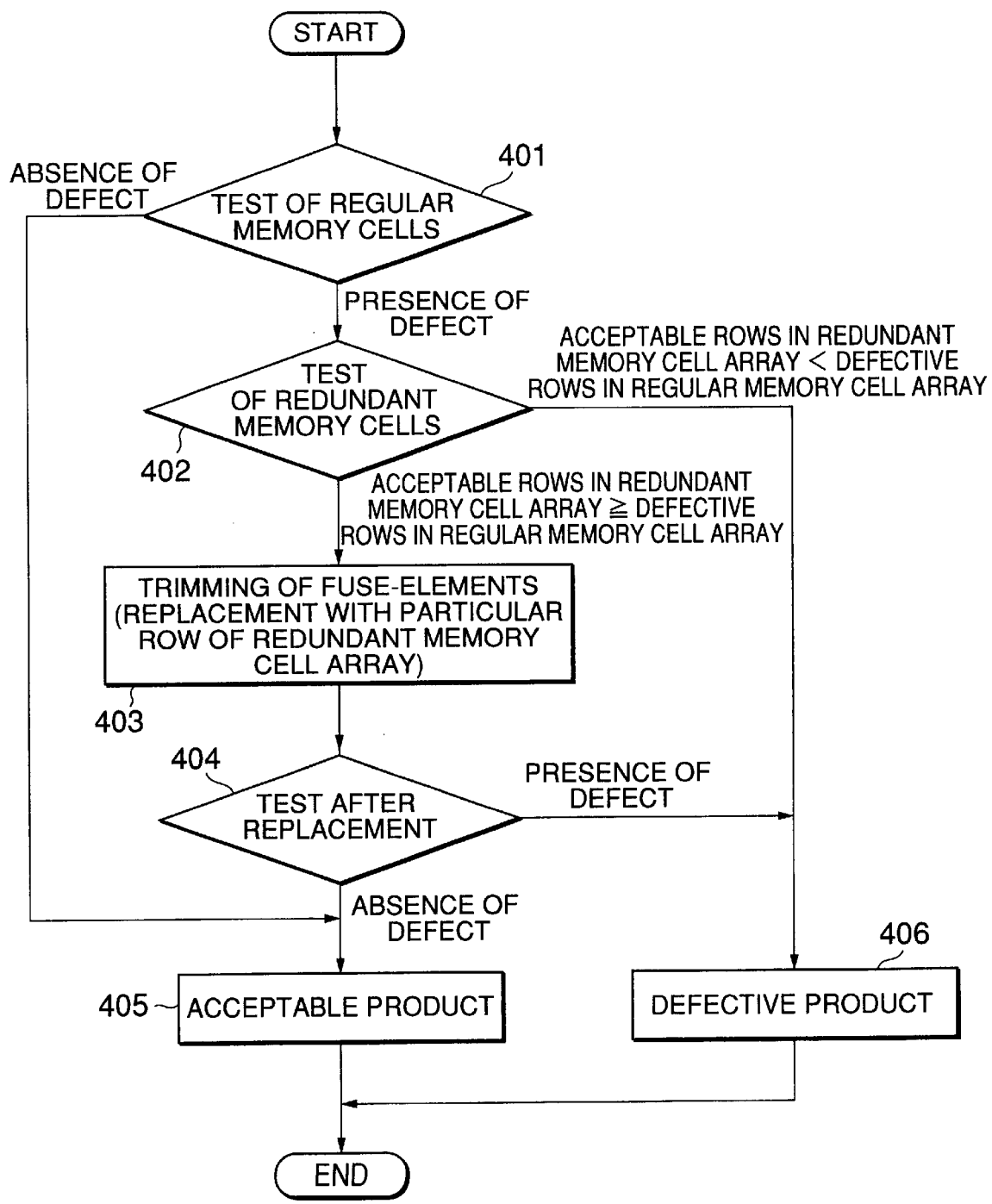
FIG. 6 is a flow chart for use in describing a conventional replacement method for replacing a defective part or row of a regular memory cell array with a particular part or row of a redundant memory cell array in the conventional semiconductor memory device illustrated in FIG. 4.

Referring to FIGS. 4 through 6, a conventional semiconductor memory device disclosed in JP-A 7-226,100 will be described in order to facilitate an understanding of the present invention. FIG. 4 is a block diagram of the conventional semiconductor memory device, FIG. 5 is a circuit diagram of a conventional redundant decoder for use in the conventional semiconductor device illustrated in FIG. 4, and FIG. 6 is a flow chart for use in describing a conventional replacement method for replacing a defective part or row of a regular memory cell array with a particular part or row of a redundant memory cell array in the conventional semiconductor memory device illustrated in FIG. 4.

As shown in FIG. 4, the conventional semiconductor memory device is similar in structure and operation to the known semiconductor memory device illustrated in FIG. 1 except that the redundant decoder is modified from that illustrated in FIG. 1 as will later become clear. The redundant decoder is therefore depicted at 15A.

The redundant decoder 15A is supplied with a test mode signal 110 as well as the address signal and the complementary address signal.

As shown in FIG. 5, the conventional redundant decoder 15A is similar in structure and operation to the known redundant decoder 15 illustrated in FIG. 2 except that the first and the second redundant decoding circuits are modified from those illustrated in FIG. 2 as will later become clear. The first and the second redundant decoding circuits are therefore depicted at 15A-1 and 15A-2, respectively.

Inasmuch as the second redundant decoding circuit 15A-2 is similar in structure to the first redundant decoding circuit 15A-1, structure of the second redundant decoding circuit 15A-2 is omitted from drawing.

The first redundant decoding circuit 15A-1 is similar in structure and operation to the first redundant decoding circuit 15-1 except that the first redundant decoding circuit 15A-1 comprises a three-input NAND gate 202 and two two-input NAND gates 204 and 205 in place of the AND gate 206.

The NAND gate 202 is supplied with the test mode signal 110, the second control signal 103b, and a first address signal 101d. The NAND gate 202 computes the NAND of the test signal 110, the second control signal 103d, and the first address signal 101d to produce a first NANDed signal. The NAND gate 204 is supplied with a signal on the common node 201 and the second control signal 103b. The NAND gate 204 computes the NAND of the signal on the common node 201 with the second control signal 103b to produce a second NANDed signal. The NAND gate 205 is supplied with the first and the second NANDed signals. The NAND gate 205 computes the NAND of the first NANDed signal with the second NANDed signal to produce a third NANDed signal as the first redundant decoded signal 105-1.

The first redundant decoded signal 105-1 is supplied to the OR gate 203. The OR gate 203 is supplied with the second redundant decoded signal 105-2 from the second redundant decoding circuit 15A-2. The OR gate 203 computes the OR of the first redundant decoded signal 105-1 and the second redundant decoded signal 105-2 to produce an ORed signal as the decode inhibit signal 106.

Description will proceed to operation of a case of testing of the redundant memory cells 14(p,n) in the first row of the redundant memory cell array 14 before replacement. In this event, all of the second control signal 103b, the first address signal 101d, and the test mode signal 110 are set with a logic high level and the first control signal 103a is set with a logic low level.

Inasmuch as the first control signal 103a has the logic low level, the P-channel MOS transistor 21 is turned on to make the common node 201 a logic high level. Inasmuch as all of the first through the sixteenth fuse-elements $20_1$ to $20_{16}$ are not fused, the common node 201 becomes a logic low level on the basis of the row address X1T–X8T of the address signal and the complementary row address X1N–X8N of the complementary address signal although the row address X1T–X8T of the address signal have any logic level. However, inasmuch as all of the second control signal 103b, the test mode signal 110, and the first address signal 110d have the logic high level, the first redundant decoded signal 105-1 has the logic high level and the decode inhibit signal 106 also has the logic high level. Inasmuch as the first redundant decoded signal 105-1 of the logic high level is indicative of active and the decode inhibit signal 106 of the logic high level is also indicative of active, operation of the regular memory cell array 11 stops and it is possible to carry out a test of the redundant memory cells 14(p,n) in the first row of the redundant memory cell array 14.

It will be assumed that a test of the redundant memory cells 14(p,n) in the second row of the redundant memory cell array 14 is carried out. In this event, a second address signal 101e is set with a logic high level in lieu of the first address signal 101d. Under the circumstance, the second redundant decoded signal 105-2 has the logic high level in place of the first redundant decoded signal 105-1.

It will be presumed that replacement of the defective row of the regular memory cell array 11 with the first row of the redundant memory cell array 14 is carried out. In this event, fusing is made about ones of the first through the sixteenth fuse-elements $22_1$ to $22_{16}$ in the first redundant decoding circuit 15A-1 that correspond to bits having the logic high level in the row address X1T–X8T of the address signal and the complementary row address X1N–X8N of the complementary address signal which indicate the address for the defective row of the regular memory cell array 11. Under the circumstances, when the address for the defective row of the regular memory cell array 11 is supplied to the redundant decoder 15A through the address signal lines 101 (FIG. 4), the common node 201 holds the logic high level. Inasmuch as the test mode signal 110 has the logic low level, the NAND gate 202 produces the first NANDed signal having the logic high level. In addition, inasmuch as the common node 201 has the logic high level and the second control signal 103b has the logic high level, the NAND gate 204 produces the second NANDed signal having the logic low level. Accordingly, the NAND gate 205 produces the first redundant decoded signal 105-1 having the logic high level and then the decode inhibit signal 106 has the logic high level. As a result, operation of the regular memory cell array 11 stops and the redundant memory cell array 14 carries out its substitute operation.

Referring to FIG. 6, description will proceed to the conventional replacement method of replacing the defective row of the regular memory cell array 11 with the acceptable row of the redundant memory cell array 14. At first, a test in the regular memory cells 11(m,n) of the regular memory cell array 11 for defects is carried out at a step 401. When any defect is not detected in the regular memory cells 11(m,n) of the regular memory cell array 11, the step 401 is followed by a step 405 at which it is made a judgment that the semiconductor memory device is an acceptable product.

It will be assumed that any defect is detected in ones of the regular memory cells 11(m,n) of the regular memory cell array 11. In this event, the step 401 proceeds to a step 402 at which a test in the redundant memory cells 14(p,n) of the redundant memory cell array 14 for defects is carried out by setting the logic high level in the test mode signal 110. It will be assumed that it is made at the step 402 a judgement that acceptable rows in the redundant memory cell array 14 are equal in number to or more in number than defective rows in the regular memory cell array 11. Under the circumstances, the step 402 is succeeded by a step 403 at which trimming of the fuse-elements in the redundant decoder 15 for the acceptable rows of the redundancy memory cell array 14 is carried out to replace the defective rows of the regular memory cell array 11 with the acceptable rows of the redundant memory cell array 14. It will be presumed that it is made at the step 402 another judgement that the acceptable rows in the redundant memory cell array 14 are less in number than the defective rows in the regular memory cell array 11. In this event, the step 402 is followed by a step 406 at which it is made a judgment that the semiconductor memory device is a defective product.

After replacement of the defective rows of the regular memory cell array 11 with the acceptable rows of the redundant memory cell array 14, the step 403 proceeds to a step 404 at which a test in the semiconductor memory device for defects after replacement is carried out. If any defect is detected in the semiconductor memory device after replacement, the step 404 is followed by the step 406 at which it is made a judgment that the semiconductor memory device is the defective product. If no defect is detected in the semiconductor memory device after replacement, the step 404 proceeds to the step 405 at which it is made a judgment that the semiconductor memory device is the acceptable product.

In the semiconductor memory device provided with the redundant decoder 15A comprising the first and the second redundant decoding circuits 15A-1 and 15A-2, selection of the first and the second rows of the redundant memory cell array 14 to be tested is carried out by supplying the first and the second address signals 101d and 101e to the first and the second redundant decoding circuits 15A-1 and 15A-2. The more the rows of the redundant memory cell array 14 increases, the more the redundant decoding circuits in the redundant decoder 15A increases. In this event, signal lines for carrying out selection of the redundant decoding circuits increase. For example, when the redundant decoding circuits in the redundant decoder 15A are equal in number to sixteen, the signal lines for carrying out selection of the redundant decoding circuits are equal in number to sixteen. In order to decrease the signal lines for carrying out selection of the redundant decoding circuits, selection of sixteen redundant decoding circuits may be made by a combination of four input signals each of which has one of the logic high level and the logic low level. However, it is necessary for the redundant decoder 15A to be provided with an address decoding circuit for converting the four input signals into sixteen output signals.

As described above, although the above-mentioned conventional semiconductor memory device can carry out a test of the redundant memory cells 14(p,n) in the redundant memory cell array 14 before replacement, the conventional semiconductor memory device has a large scale in circuitry in a case where application is made about the semiconductor memory device comprising the redundant memory cell array including a lot of rows or a lot of redundant memory cells. This is because the conventional semiconductor memory device must comprise the redundant decoder provided with the address decoding circuit.

Figure 7:
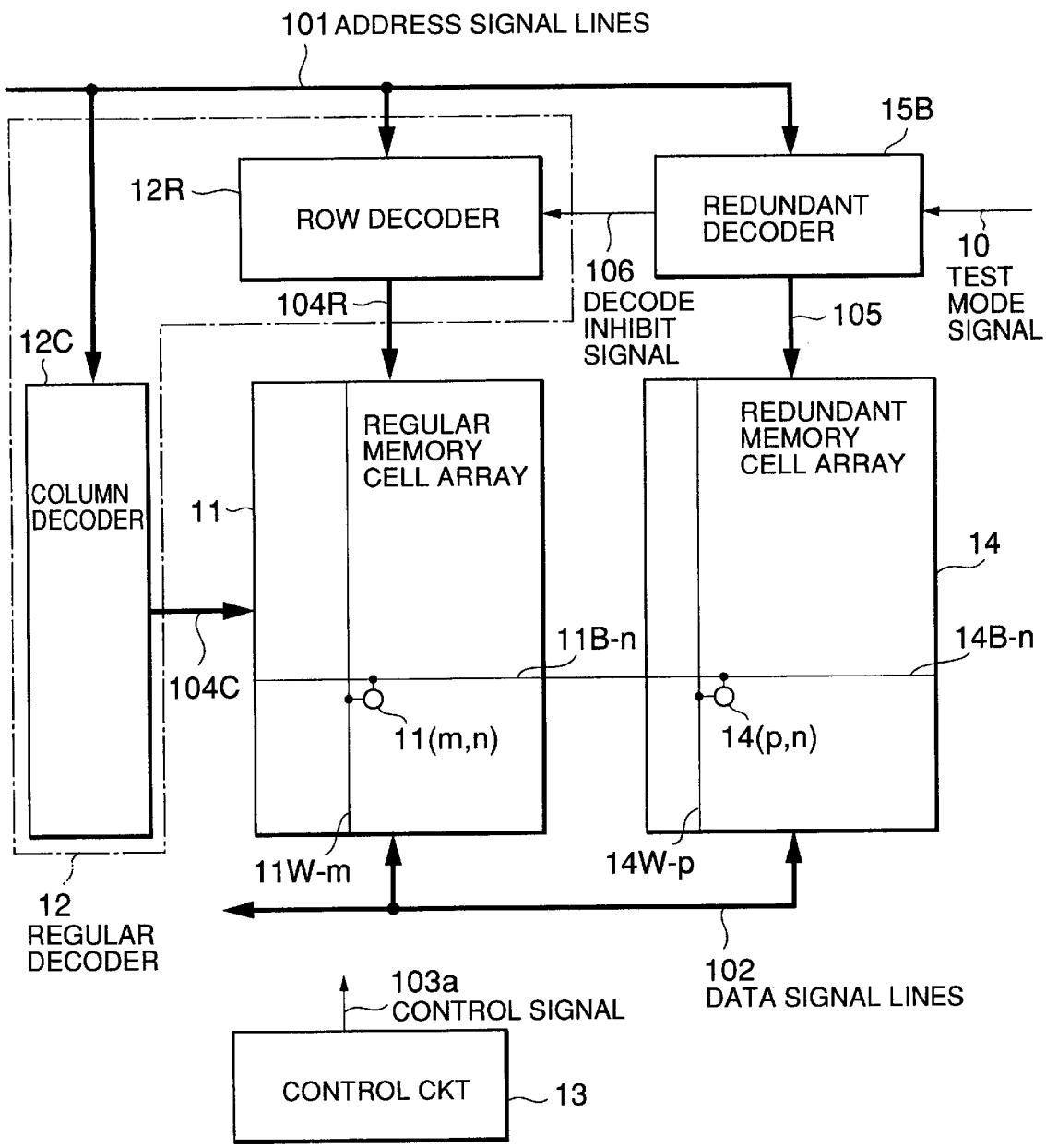
FIG. 7 is a block diagram of a semiconductor memory device according to a first embodiment of this invention.
Figure 8:
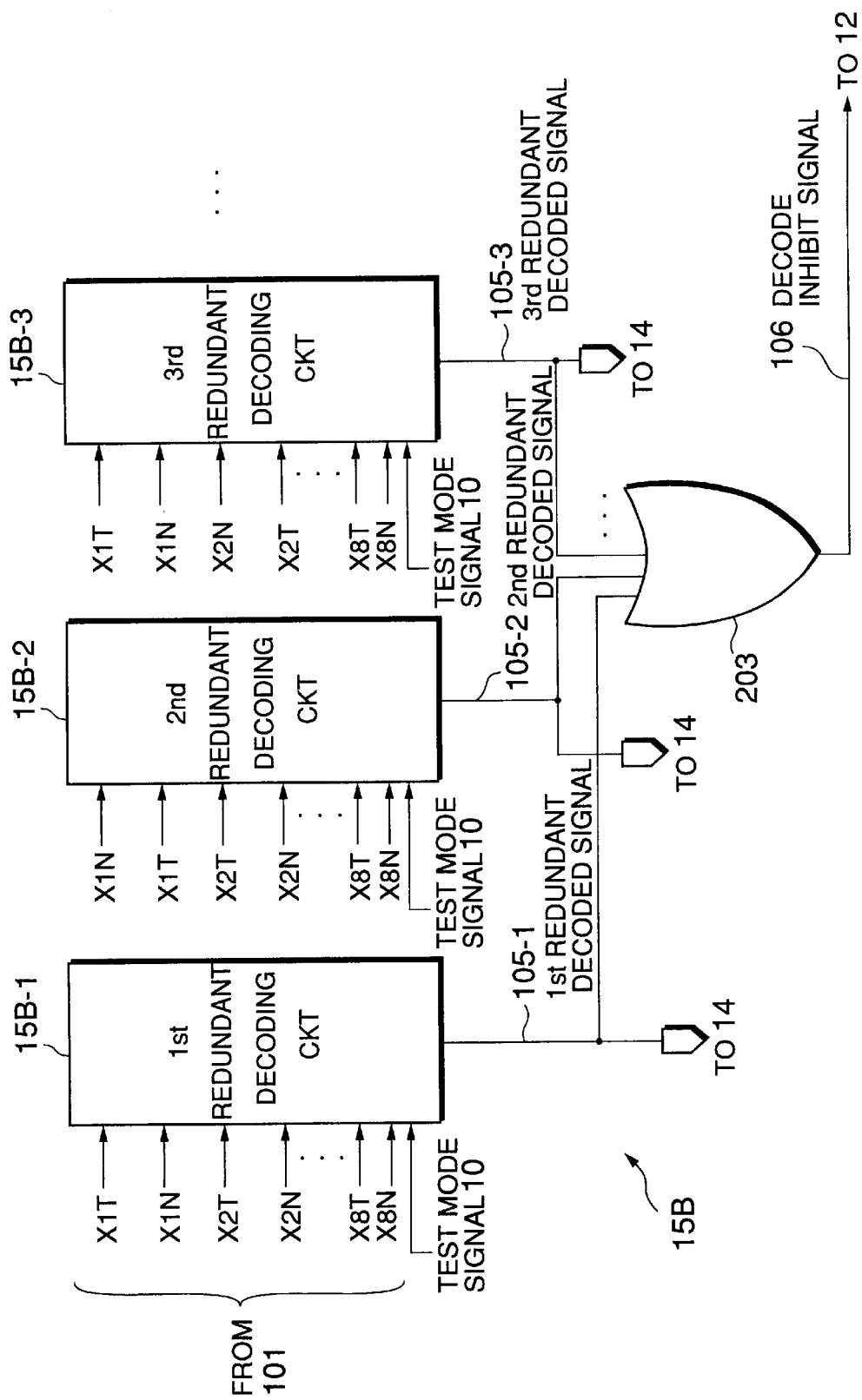
FIG. 8 is a block diagram of a redundant decoder for use in the semiconductor memory device illustrated in FIG. 7.

Referring to FIGS. 7 and 8, the description will proceed to a semiconductor memory device according to a first embodiment of this invention. FIG. 7 is a block diagram of the semiconductor memory device and FIG. 8 is a block diagram of a redundant decoder for use in the semiconductor device illustrated in FIG. 7.

As shown in FIG. 7, the semiconductor memory device is similar in structure and operation to the conventional semiconductor memory device illustrated in FIG. 4 except that the redundant decoder is modified from that illustrated in FIG. 4 as will later become clear. The redundant decoder is therefore depicted at 15B. The redundant decoder 15B is supplied with a test mode signal 10 instead of the test mode signal 110. The test mode signal 10 has a logic low level on carrying out a test of the redundant memory cells 14(p,n) in the redundant memory cell array 14 before replacement. Otherwise, the test mode signal 10 has a logic high level. That is, the test mode signal 10 has a reversed logical value of the test mode signal 110.

As shown in FIG. 8, the redundant decoder 15B is similar in structure and operation to the conventional redundant decoder 15A illustrated in FIG. 5 except that the redundant decoder 15B comprises three or more redundant decoding circuits as will later become clear. That is, the redundant decoder 15B comprises the first redundant decoding circuit 15B-1, the second redundant decoding circuit 15B-2, a third redundant decoding circuit 15B-3, . . . , and so on which are similar in structure and operation to each other.

Each of the first, the second, the third redundant decoding circuits 15B-1, 15B-2, 15B-3, . . . , and so on is supplied with the row address X1T–X8T of the address signal, the complementary row address X1N–X8N of the complementary address signal, and the test mode signal 10. In the first, the second, the third redundant decoding circuits 15B-1, 15B-2, 15B-3, . . . , and so on, the row address X1T–X8T of the address signal and the complementary row address X1N–X8N of the complementary address signal are supplied in different order. In other words, at least one pair of a bit in the row address X1T–X8T and a corresponding bit in the complementary row address X1N–X8N is supplied in the reverse sequence. In the example being illustrated, inasmuch as the row address X1T–X8T of the address signal is eight bits in length, there is eight pairs in the row address X1T–X8T and the complementary row address X1N–X8N and it is possible to obtain an inputting sequence selected from a combination of $2^8$ or 256 kinds.

For example, the first redundant decoding circuit 15B-1 is supplied with the row address X1T–X8T of the address signal and the complementary row address X1N–X8N of the complementary address signal in the standard sequence while the second redundant decoding circuit 15B-2 is supplied with the row address X1T–X8T of the address signal and the complementary row address X1N–X8N of the complementary address signal with the first bit X1T and the first complementary bit X1T reversed as against the first redundant decoding circuit 15B-1. In addition, the third redundant decoding circuit 15B-3 is supplied with the row address X1T–X8T of the address signal and the complementary row address X1N–X8N of the complementary address signal with the second bit X2T and the second complementary bit X2T reversed as compared with the first redundant decoding circuit 15B-1.

The first, the second, the third redundant decoding circuits 15B-1, 15B-2, 15B-3, . . . , and so on produce the first, the second, a third redundant decoded signals 105-1, 105-2, 105-3, . . . , and so on which are supplied to the OR gate 203. The OR gate 203 calculates the logical OR of the first, the second, the third redundant decoded signals 105-1, 105-2, 105-3, . . . , and so on to produce an ORed signal as the decode inhibit signal 106.

Figure 9:
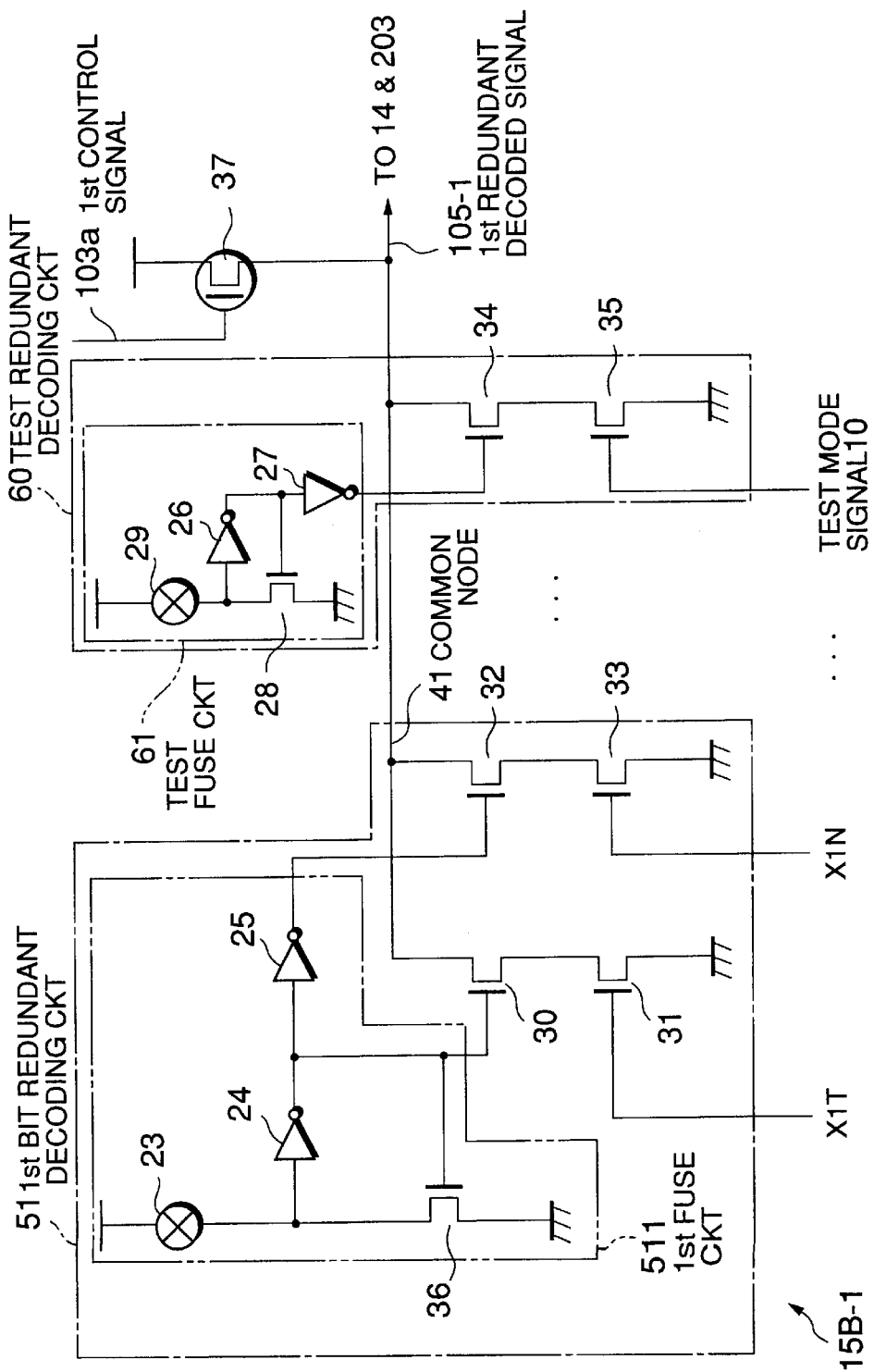
FIG. 9 is a circuit diagram of a redundant decoding circuit for use in the redundant decoder illustrated in FIG. 8.

Referring to FIG. 9, the description will proceed to the first redundant decoding circuit 15B-1 illustrated in FIG. 8. The first redundant decoding circuit 15B-1 comprises a first bit redundant decoding circuits 51 and a test redundant decoding circuit 60. Although the first redundant decoding circuit 15B-1 further comprises second through eighth bit redundant decoding circuits, illustration thereof is omitted from the figure. This is because each of the second through the eighth bit redundant decoding circuits is similar in structure and operation to the first bit redundant decoding circuit 51.

The first bit redundant decoding circuit 51 is supplied with the first bit X1T of the row address and the first complementary bit X1N of the complementary row address. The first bit redundant decoding circuit 51 comprises a first fuse circuit 511 and four N-channel MOS transistors 30, 31, 32, and 33. The first fuse circuit 511 comprises a first fuse-element 23, two inverters 24 and 25, and an N-channel MOS transistor 36.

The first fuse-element 23 has an end supplied with a high-level potential and another end which is connected to an input terminal of the inverter 24 and a drain electrode of the N-channel MOS transistor 36. The N-channel MOS transistor 36 has a source electrode supplied with a grounding or low-level potential and a gate electrode connected to an output terminal of the inverter 24. The output terminal of the inverter 24 is connected to an input terminal of the inverter 25. The output terminal of the inverter 24 in the first fuse circuit 511 produces a first bit fuse output signal. In addition, the inverter 25 in the first fuse circuit 511 has an output terminal for producing a first complementary bit fuse output signal.

It will be assumed that the first fuse-element 23 is not fused or not trimmed. In this event, the inverter 24 is supplied with a logic high level and then the inverter 24 produces the first bit fuse output signal having a logic low level which is indicative of inactive. Inasmuch as the inverter 25 inverts the first bit fuse output signal, the inverter 25 produces the first complementary bit fuse output signal having a logic high level which is indicative of active.

It will presumed that the first fuse-element 23 is fused or trimmed. In this event, the inverter 24 is supplied with a logic low level and then the inverter 24 produces the first bit fuse output signal having a logic high level which is indicative of active. The inverter 25 produces the first complementary bit fuse output signal having a logic low level which is indicative of inactive. Responsive to the first bit fuse output signal having the logic high level, the N-channel MOS transistor 36 is turned on to fix the input terminal of the inverter 24 in the logic low level. As a result, operation of the inverter 24 is stabilized.

The N-channel MOS transistor 30 has a drain electrode connected to a common node 41 and a gate electrode supplied with the first bit fuse output signal. The common node 41 serves as a first redundant decoded signal line for producing the first redundant decoded signal 15-1. The N-channel MOS transistor 31 has a drain electrode connected to a source electrode of the N-channel MOS transistor 30, a gate electrode supplied with the first bit X1T of the row address, and a source electrode supplied with the grounding or low-level potential. The N-channel MOS transistor 32 has a drain electrode connected to the common node 41 and a gate electrode supplied with the first complementary bit fuse output signal. The N-channel MOS transistor 33 has a drain electrode connected to a source electrode of the N-channel MOS transistor 32, a gate electrode supplied with first complementary bit X1N of the complementary row address, and a source electrode supplied with the grounding or low-level potential.

Supplied with the first bit fuse output signal having the logic high level to the gate electrode of the N-channel MOS transistor 30, the N-channel MOS transistor 30 is turned on. Supplied with the first bit X1T of the row address having the logic high level to the gate electrode of the N-channel MOS transistor 31, the N-channel MOS transistor 31 is turned on. When both of the N-channel MOS transistors 30 and 31 are turned on, the common node 41 has a potential of a logic low level. Supplied with the first complementary bit fuse output signal having the logic high level to the gate electrode of the N-channel MOS transistor 32, the N-channel MOS transistor 32 is turned on. Supplied with the first complementary bit X1N of the complementary row address having the logic high level to the gate electrode of the N-channel MOS transistor 33, the N-channel MOS transistor 33 is turned on. When both of the N-channel MOS transistors 32 and 33 are turned on, the common node has the potential of the logic low level.

The test redundant decoding circuit 60 is supplied with the test mode signal 10. The test redundant decoding circuit 60 comprises a test fuse circuit 61 and two N-channel MOS transistors 34 and 35. The test fuse circuit 61 comprises a test fuse-element 29, two inverters 26 and 27, and an N-channel MOS transistor 28.

The test fuse-element 29 has an end supplied with the high-level potential and another end which is connected to an input terminal of the inverter 26 and a drain electrode of the N-channel MOS transistor 28. The N-channel MOS transistor 28 has a source electrode supplied with the grounding or low-level potential and a gate electrode connected to an output terminal of the inverter 26. The output terminal of the inverter 26 is connected to an input terminal of the inverter 27. The inverter 27 in the test fuse circuit 61 has an output terminal producing a test fuse output signal.

It will be assumed that the test fuse-element 29 is not fused or not trimmed. In this event, the inverter 26 is supplied with the high-level potential having a logic high level and then the inverter 26 produces an output signal having a logic low level. Inasmuch as the inverter 27 inverts the output signal of the inverter 26, the inverter 27 produces the test fuse output signal having a logic high level which is indicative of active.

It will presumed that the test fuse-element 29 is fused or trimmed. In this event, the inverter 26 is supplied with a signal having a logic low level and then the inverter 26 produces the output signal having a logic high level. The inverter 27 produces the test fuse output signal having a logic low level which is indicative of inactive. Responsive to the output signal having the logic high level from the inverter 26, the N-channel MOS transistor 28 is turned on to fix the input terminal of the inverter 26 in the logic low level. As a result, operation of the inverter 26 is stabilized.

The N-channel MOS transistor 34 has a drain electrode connected to the common node 41 and a gate electrode supplied with the test fuse output signal. The N-channel MOS transistor 35 has a drain electrode connected to a source electrode of the N-channel transistor 34, a gate electrode supplied with the test mode signal 10, and a source electrode supplied with the grounding or low-level potential.

Supplied with the test fuse output signal having the logic high level to the gate electrode of the N-channel MOS transistor 34, the N-channel MOS transistor 34 is turned on. In other words, the N-channel MOS transistor 34 is turned on if the test fuse-element 29 is not fused or not trimmed. Supplied with the test mode signal 10 having the logic high level to the gate electrode of the N-channel MOS transistor 35, the N-channnle MOS transistor 35 is turned on. When both of the N-channel MOS transistors 34 and 35 are turned on, the common node 41 has the potential of the logic low level.

The first redundant decoding circuit 15B-1 further comprises a P-channel MOS transistor 37. The P-channel MOS transistor 37 has a source electrode supplied with the high-level potential, a gate electrode supplied with the first control signal 103a, and a drain electrode connected to the common node 41. Supplied with the first control signal 103a having a logic low level to the gate electrode of the P-channel MOS transistor 37, the P-channel MOS transistor 27 is turned on to make the common node 41 the logic high level. That is, the P-channel MOS transistor 37 acts as a charging arrangement for charging the common node 41 with the high-level potential on carrying out a test of the first row of the redundant memory cell array 14 before replacement.

In the conventional redundant decoder 15A illustrated in FIG. 5, each of the first and the second redundant decoding circuits 15A-1 and 15A-2 comprises two fuse-elements for the first bit X1T of the row address, namely, the first fuse-element $22_1$ for the first bit X1T of the row address and the second fuse-element $22_2$ for the first complementary bit X1N of the complementary row address. In contrast to this, the first redundant decoding circuit 15B-1 according to the present invention comprises only one fuse element 23 for the first bit X1T of the row address by connecting the N-channel MOS transistors 30 and 31 in series and by connecting the N-channel MOS transistors 32 and 33 in series. In addition, such a circuitry have been used in recent years. The reason why such a circuitry is used will presently be described.

Inasmuch as a storage capacity of the semiconductor memory device increases drastically, it is necessary to compact an area occupied by a peripheral circuit. However, an area occupied by a fuse-element is larger than an area occupied by another element. This is because the fuse-element necessitates a predetermined size or more so as to enable to fuse the fuse-element by a laser trimming or the like. Accordingly, a method of using one fuse-element for one bit of an address signal such as the first redundant decoding circuit 15B-1 illustrated in FIG. 9 is employed.

Referring to FIG. 9 in addition to FIGS. 7 and 8, description will be made about operation of the first redundant decoding circuit 15B-1.

Description will be at first made about operation in a case of carrying out a test of the regular memory cell array 11. In this case, inasmuch as the test signal 10 has the logic high level indicative of inactive, the N-channel MOS transistor 35 in the test redundant decoding circuit 60 is turned on. In addition, inasmuch as the test fuse-element 29 of the test fuse circuit 61 is not fused or not trimmed, the N-channel MOS transistor 34 in the test redundant decoding circuit 60 is turned on. Accordingly, the common node 41 has the logic low level to produce the first redundant decoded signal 105-1 having the logic low level. Likewise, the second, the third redundant decoding circuits 15B-2, 15B-3, . . . , and so on produce the second, the third redundant decoded signals 105-2, 105-3, . . . , and so on each of which has the logic low level. Accordingly, the redundant decoder 15B produces the decode inhibit signal 106 having the logic low level indicative of inactive. As a result, it is possible to carry out the test of the regular memory cell array 11.

Description will be made about operation in a case of carrying out a test of the first row in the redundant memory cell array 14 before replacement. The first control signal 103a is set with the logic low level to make the P-channel MOS transistor 37 turn on. Accordingly, the common node 41 is charged with the logic high level. In addition, all of the first through the eighth bits X1T to X8T of the row address are set with the logic high level, namely, "1111 1111". In this event, all of the first through the eighth complementary bits X1N to X8N of the complementary row address justly become the logic low level, namely, "0000 0000".

Attention will be directed to the first bit redundant decoding circuit 51 in the first redundant decoding circuit 15B-1 that are supplied with the first bit X1N of the row address and the first complementary bit X1N of the complementary row address. Inasmuch as the first bit X1T of the row address has the logic high level, the N-channel MOS transistor 31 is turned on. Inasmuch as the first fuse-element 23 is not fused or not trimmed, the inverter 24 produces the first bit fuse output signal having the logic low level and the N-channel MOS transistor 30 is not turned on. In addition, the inverter 25 produces the first complementary bit fuse output signal having the logic high level to turn the N-channel MOS transistor 30 on. Inasmuch as the first complementary bit X1N of the complementary row address has the logic low level, the N-channel MOS transistor is not turned on. Accordingly, the common node 41 is held to the logic high level.

Similar operation is carried out in the second through the eighth bit redundant decoding circuits which are supplied with the second through the eighth bits X2T to X8T of the row address and with the second through the eighth complementary bits X2N to X8N of the complementary row address, respectively, and results in holding the common node 41 the logic high level. In addition, the test mode signal 10 is set with the logic low level to turn the N-channel MOS transistor 35 off. As a result, the common node 41 is held to the logic high level although the N-channel MOS transistor 34 is turned on. Inasmuch as the common node 41 is held to the logic high level, the first redundant decoding circuit 15B-1 produces the first redundant decoded signal 105-1 having the logic high level. As a result, it is possible to carry out the test of the first row in the redundant memory cell array 14 before replacement.

It will be assumed that it is judged that the first row of the redundant memory cell array 14 is the acceptable row. Description will be made about operation in a case of replacing a defective row of the regular memory cell array 11 with the first row of the redundant memory cell array 14. In this event, the fuse-element(s) in the fuse circuit(s), which correspond(s) to bit(s) indicative of "0" in the address for the defective row of the regular memory cell array 11 to be replaced, is (are) fused or trimmed. In addition, the test fuse-element 29 of the test fuse circuit 61 is fused or trimmed. Inasmuch as the test fuse-element 29 is fused or trimmed, the test fuse circuit 61 produces the test fuse output signal having the logic low level to make the N-channel MOS transistor 34 put into OFF state. As a result, the first redundant decoding circuit 15B-1 produces the first redundant decoded signal 105-1 having the logic high level to activate the first row of the redundant memory cell array 14 that replaces the defective row of the regular memory cell array only when the redundant decoder 15B or the first redundant decoding circuit 15B-1 is supplied with the address signal indicative of the row address for the defective row of the regular memory cell array 11.

While the above-mentioned description has been made as regards operation of the first redundant decoding circuit 15B-1, "0111 1111" are supplied to the redundant decoder 15B as the first through the eighth bits X1T to X8T of the row address in a case of carrying out a test of the second row in the redundant memory cell array 14 that is connected to the second redundant decoding circuit 15B-2. The first and the second redundant decoding circuit 15B-1 and 15B-2 are supplied with the address signal with the first bit X1T of the row address changed places with the first complementary bit X1N of the complementary row address, as shown in FIG. 8. As a result, when "0111 1111" are supplied as the row address, the second redundant decoding circuit 15B-2 is activated to produce the second redundant decoded signal 105-2 having the logic high level but the first redundant decoding circuit 15B-1 is inactivated to produce the first redundant decoded signal 105-1 having the logic low level.

Similarly, "1011 1111" are supplied to the redundant decoder 15B as the first through the eighth bits X1T to X8T of the row address in a case of carrying out a test of the third row of the redundant memory cell array 14 that is connected to the third redundant decoding circuit 15B-3.

In the above-mentioned embodiment, each of the first, the second, the third redundant decoding circuits 15B-1, 15B-2, 15B-3, . . . , and so on comprises the N-channel MOS transistor 35 between the N-channel MOS transistor 34 and a ground in which the N-channel MOS transistor 35 is turned on or off when the test mode signal 10 has the logic high level or the logic low level. With this structure, it is possible to make the common node 41 the logic high level although the test fuse-element 29 is not fused or not trimmed.

In addition, inasmuch as input sequences for the row address X1T–X8T and the complementary row address X1N–X9N supplied to the first, the second, the third redundant decoding circuits 15B-1, 15B-2, 15B-3, . . . , and so on are different from each other, it is possible to carry out selection of the first, the second, the third redundant decoding circuits 15B-1, 15B-2, 15B-3, . . . , and so on without any address decoding circuit.

Figure 10:
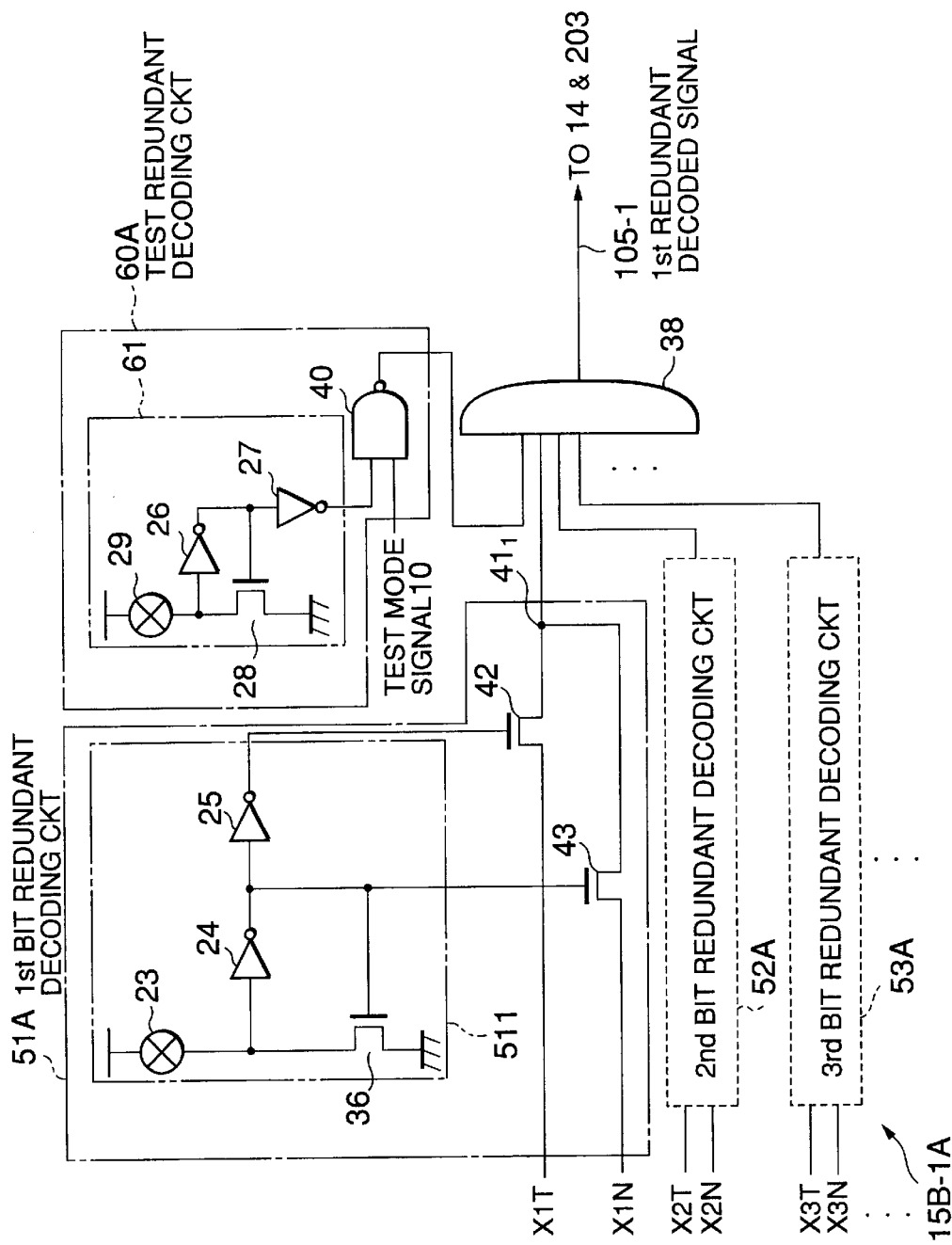
FIG. 10 is a circuit diagram of another redundant decoding circuit for use in the redundant decoder illustrated in FIG. 8.

Referring to FIG. 10, the description will proceed to another redundant decoding circuit for use in the redundant decoder 15B. FIG. 10 shows only a first redundant decoding circuit 15B-1A. This is because each of a second redundant decoding circuit, a third redundant decoding circuit, . . . , and so on is similar in structure and operation to the first redundant decoding circuit 15B-1A.

The first redundant decoding circuit 15B-1A comprises first through eighth bit redundant decoding circuits 51A, 52A, 53A, . . . , and so on, a test redundant decoding circuit 60A, and an AND circuit 38. Illustration of the second through the eighth bit redundant decoding circuits is omitted from the figure. This is because each of the second through the eighth bit redundant decoding circuits is similar in structure and operation to the first bit redundant decoding circuit 51A.

The first bit redundant decoding circuit 51A is similar in structure and operation to the first bit redundant decoding circuit 51 illustrated in FIG. 9 except that the first bit redundant decoding circuit 51A comprises two N-channel MOS transistors 42 and 43 in lieu of the four N-channel MOS transistors 30, 31, 32, and 33.

The first bit redundant decoding circuit 51A has a first bit redundant output node $41_1$ for supplying the AND circuit 38 with a first bit redundant decoded signal indicative of active at the logic high level. The N-channel MOS transistor 42 has a drain electrode connected to the first bit redundant output node $41_1$, a gate electrode supplied with the first complementary bit fuse output signal, and a source electrode supplied with the first bit X1T of the row address. The N-channel MOS transistor 43 has a drain electrode connected to the first bit redundant output node $41_1$, a gate electrode supplied with the first bit fuse output signal, and a source electrode supplied with the first complementary bit X1N of the complementary row address.

Supplied with the first complementary bit fuse output signal having the logic high level to the gate electrode of the N-channel MOS transistor 42, the N-channel MOS transistor 42 is turned on to supply the first bit X1T of the row address from the first bit redundant output node $41_1$ to an input terminal of the AND circuit 38. Supplied with the first bit fuse output signal having the logic high level to the gate electrode of the N-channel MOS transistor 43, the N-channel MOS transistor 43 is turned on to supply the first complementary bit X1N of the complementary row address from the first bit redundant output node $41_1$ to the input terminal of the AND circuit 38.

Similarly, the second through the eighth bit redundant decoding circuits 51A, 53A, . . . , and so on produce second through eighth bit redundant decoded signals.

The test redundant decoding circuit 60A is similar in structure and operation to the test redundant decoding circuit 60 illustrated in FIG. 9 except that the test redundant decoding circuit 60A comprises a NAND circuit 40 in place of the two N-channel MOS transistors 34 and 35.

The NAND circuit 40 has an input terminal supplied with the test fuse output signal and another input terminal supplied with the test mode signal 10. The NAND circuit 40 has an output terminal connected to another input terminal of the AND circuit 38. The NAND circuit 40 computes the NAND of the test fuse output signal with the test mode signal 10 to produce a NANDed signal as a test redundant decoded signal which supplied to an input terminal of the AND circuit 38. That is, the NAND circuit 40 serves as a combining arrangement for combining the test fuse output signal with the test mode signal 10 to produce a combined signal as the rest redundant decoded signal.

The AND circuit 38 computes the AND of the test redundant decoded signal and the first through the eighth bit redundant decoded signals to produce an ANDed signal as the first redundant decoded signal 105-1.

Referring to FIG. 10 in addition to FIGS. 7 and 8, description will be made about operation of the first redundant decoding circuit 15B-1A.

Description will be at first made about operation in a case of carrying out a test of the regular memory cell array 11. In this case, the test mode signal 10 is set with the logic high level indicative of inactive. Inasmuch as the test fuse circuit 61 produces the test fuse output signal having the logic high level, the NAND circuit 40 produces the NANDed signal having the logic low level as the redundant decoded signal. Accordingly, the AND circuit 38 produces the first redundant decoded signal 105-1 having the logic low level. Likewise, the second, the third redundant decoding circuits, . . . , and so on produce the second, the third redundant decoded signals 105-2, 105-3, . . . , and so on each of which has the logic low level. Accordingly, the redundant decoder 15B produces the decode inhibit signal 106 having the logic low level indicative of inactive. As a result, it is possible to carry out the test of the regular memory cell array 11.

Description will be made about operation in a case of carrying out a test of the first row in the redundant memory cell array 14 before replacement. All of the first through the eighth bits X1T to X8T of the row address are set with the logic high level, namely, "1111 1111". In this event, all of the first through the eighth complementary bits X1N to X8N of the complementary row address justly become the logic low level, namely, "0000 0000".

Attention will be directed to the first bit redundant decoding circuit 51A in the first redundant decoding circuit 15B-1A that are supplied with the first bit X1T of the row address and the first complementary bit X1N of the complementary row address. Inasmuch as the first fuse-element 23 is not fused or not trimmed, the inverter 24 produces the first bit fuse output signal having the logic low level and the inverter 25 produces the first complementary bit fuse output signal having the logic high level. Accordingly, the N-channel MOS transistor 42 is turned on while the N-channel MOS transistor 43 is turned off. As a result, the first bit X1T of the row address having the logic high level is supplied to the AND circuit 38 as the first bit redundant decoded signal.

Similar operation is carried out in the second through the eighth bit redundant decoding circuits which are supplied with the second through the eighth bits X2T to X8T of the row address and with the second through the eighth complementary bits X2N to X8N of the complementary row address, respectively. In addition, the second through the eighth bits X2T to X8T of the row address each having the logic high level are also supplied to the AND circuit 38 as the second through the eighth bit redundant decoded signals, respectively. In addition, the test mode signal 10 is set with the logic low level and then the NAND circuit 40 produces the NANDed signal having the logic high level as the test redundant decoded signal. As a result, the AND circuit 38 produces the first redundant decoded signal 105-1 having the logic high level. It is therefore possible to carry out the test of the first row in the redundant memory cell array 14 before replacement.

It will be assumed that it is judged that the first row of the redundant memory cell array 14 is the acceptable row. Description will be made about operation in a case of replacing a defective row of the regular memory cell array 11 with the first row of the redundant memory cell array 14. In this event, the fuse-element(s) in the fuse circuit(s), which correspond(s) to bit(s) indicative of "0" in the address for the defective row of the regular memory cell array 11 to be replaced, is (are) fused or trimmed. In addition, the test fuse-element 29 of the test fuse circuit 61A is fused or trimmed. Inasmuch as the test fuse-element 29 is fused or trimmed, the test fuse circuit 61 produces the test fuse output signal having the logic low level to make the NAND circuit 40 produce the NANDed signal having the logic high level as the test redundant decoded signal. As a result, the first redundant decoding circuit 15B-1A produces the first redundant decoded signal 105-1 having the logic high level to activate the first row of the redundant memory cell array 14 that replaces the defective row of the regular memory cell array only when the redundant decoder 15B or the first redundant decoding circuit 15B-1A is supplied with the address signal indicative of the row address for the defective row of the regular memory cell array 11.

While the above-mentioned description has been made as regards operation of the first redundant decoding circuit 15B-1A, the second, the third redundant decoding circuits, . . . , and so on may be selected in the similar manner described above in cases of carrying out tests of the second, the third rows, and so on in the redundant memory cell array 14 that are connected to the second, the third redundant decoding circuits, . . . , and so on.

In the above-mentioned embodiment, the first redundant decoding circuits 15B-1A comprises the NAND circuit 40 between the test fuse circuit 61 and the AND circuit 38 in which the NAND circuit 40 is supplied with the test mode signal 10. With this structure, it is possible to make the AND circuit 38 produce the first redundant decoded signal 105-1 having the logic high level on testing of the redundant memory cell array 14 although the test fuse-element 29 is not fused or not trimmed.

Figure 11:
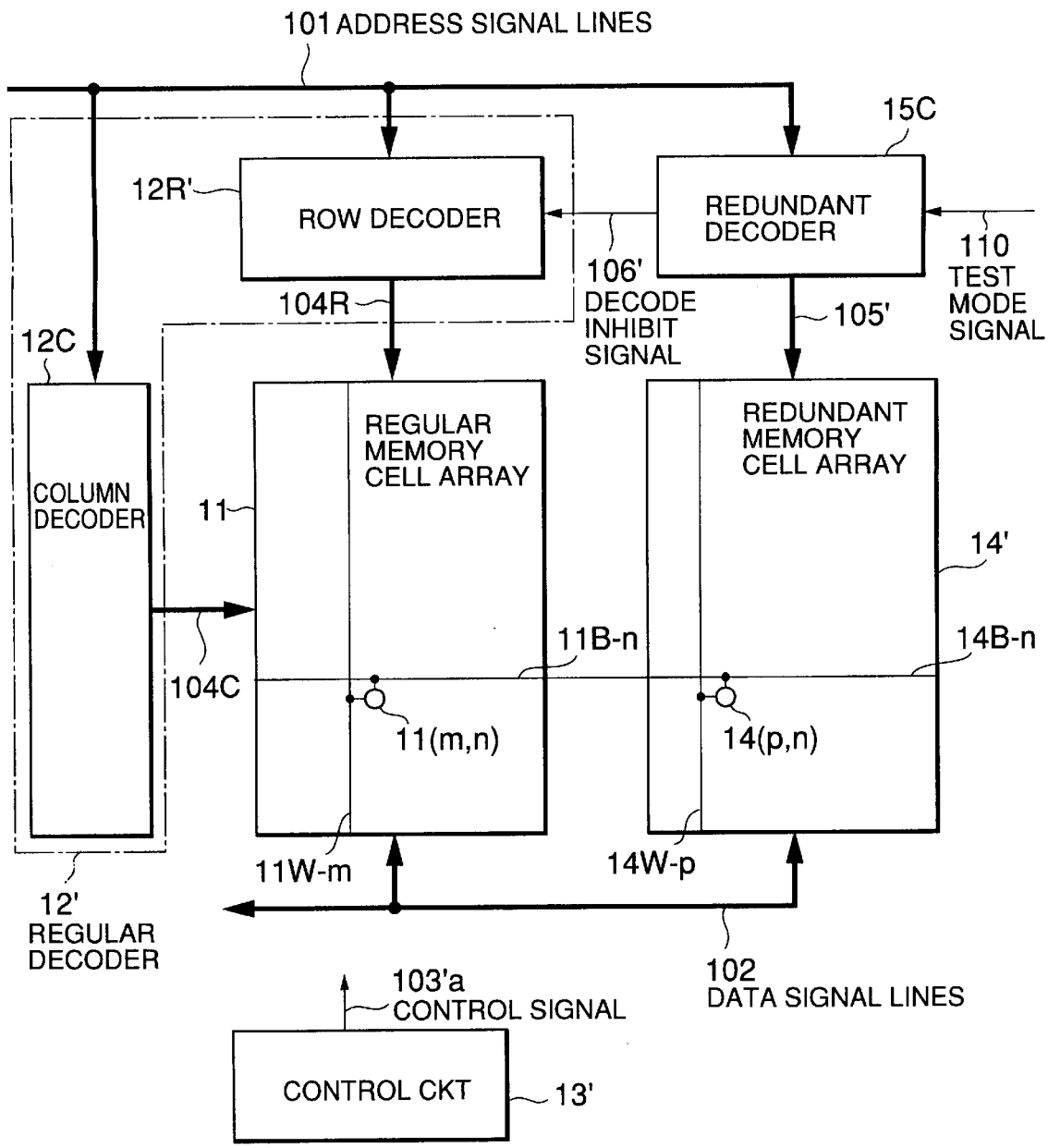
FIG. 11 is a block diagram of a semiconductor memory device according to a second embodiment of this invention.
Figure 12:
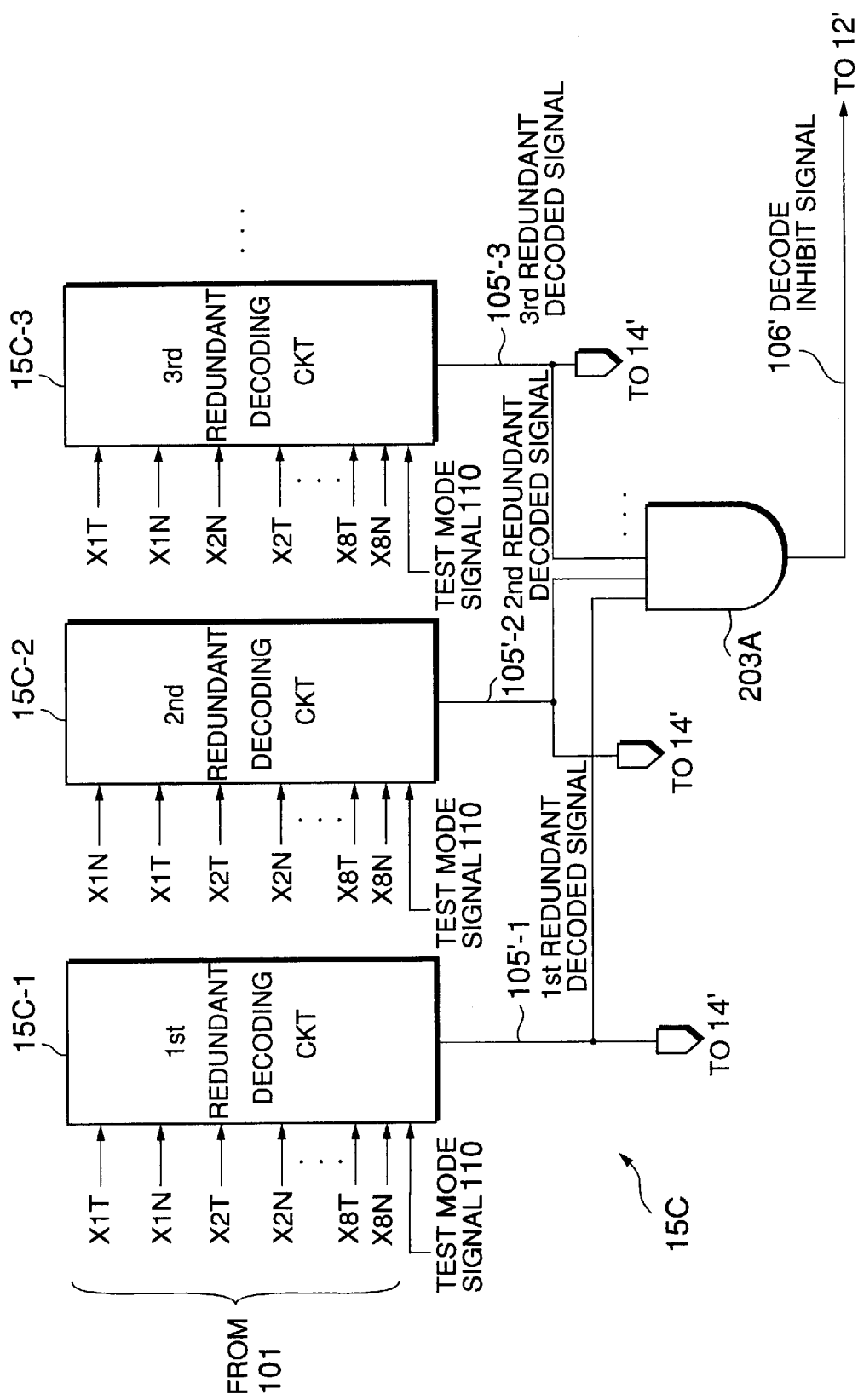
FIG. 12 is a block diagram of a redundant decoder for use in the semiconductor memory device illustrated in FIG. 11.

Referring to FIGS. 11 and 12, the description will proceed to a semiconductor memory device according to a second embodiment of this invention. FIG. 11 is a block diagram of the semiconductor memory device and FIG. 12 is a block diagram of a redundant decoder for use in the semiconductor memory device illustrated in FIG. 11.

As shown in FIG. 11, the semiconductor memory device is similar in structure and operation to the semiconductor memory device illustrated in FIG. 7 except that the redundant decoder, the redundant memory cell array, the regular decoder, and the control circuit are modified from those illustrated in FIG. 7 as will later become clear. The redundant decoder, the redundant memory cell array, the regular decoder, and the control circuit are therefore depicted at 15C, 14', 12', and 13', respectively.

The redundant decoder 15C is supplied with the test mode signal 110. In addition, the redundant decoder 15C produces a decode inhibit signal 106' indicative of active at the logic low level and redundant decoded signals 105' each of which is indicative of active at the logic low level. The redundant memory cell array 14' is activated by any one of the redundant decoded signals 105' indicative of active. The regular decoder 12' comprises a row decoder 12R' which is inactivated by the decode inhibit signal 106' indicative of active. The control circuit 13' supplies the redundant decoder 15C with a first control signal 103'a indicative of active at the logic low level.

As shown in FIG. 12, the redundant decoder 15C is similar in structure and operation to the redundant decoder 15B illustrated in FIG. 8 except that the first redundant decoding circuit, the second redundant decoding circuit, the third redundant decoding circuit, . . . , and so on are modified from those illustrated in FIG. 8 as will later become clear and the redundant decoder 15C comprises an AND gate 203A in place of the OR gate 203. The first redundant decoding circuit, the second redundant decoding circuit, the third redundant decoding circuit, . . . , and so on are therefore depicted at 15C-1, 15C-2, 15C-3, . . . , and so on, respectively.

Each of the first, the second, the third redundant decoding circuits 15C-1, 15C-2, 15C-3, . . . , and so on is supplied with the row address X1T–X8T of the address signal, the complementary row address X1N–X8N of the complementary address signal, and the test mode signal 110.

The first, the second, the third redundant decoding circuits 15C-1, 15C-2, 15C-3, . . . , and so on produce a first, a second, a third redundant decoded signals 105'-1, 105'-2, 105'-3, . . . , and so on which are supplied to the AND gate 203A. The AND gate 203A calculates the logical OR of the first, the second, the third redundant decoded signals 105'-1, 105'-2, 105'-3, . . . , and so on to produce an ANDed signal as the decode inhibit signal 106'.

Figure 13:
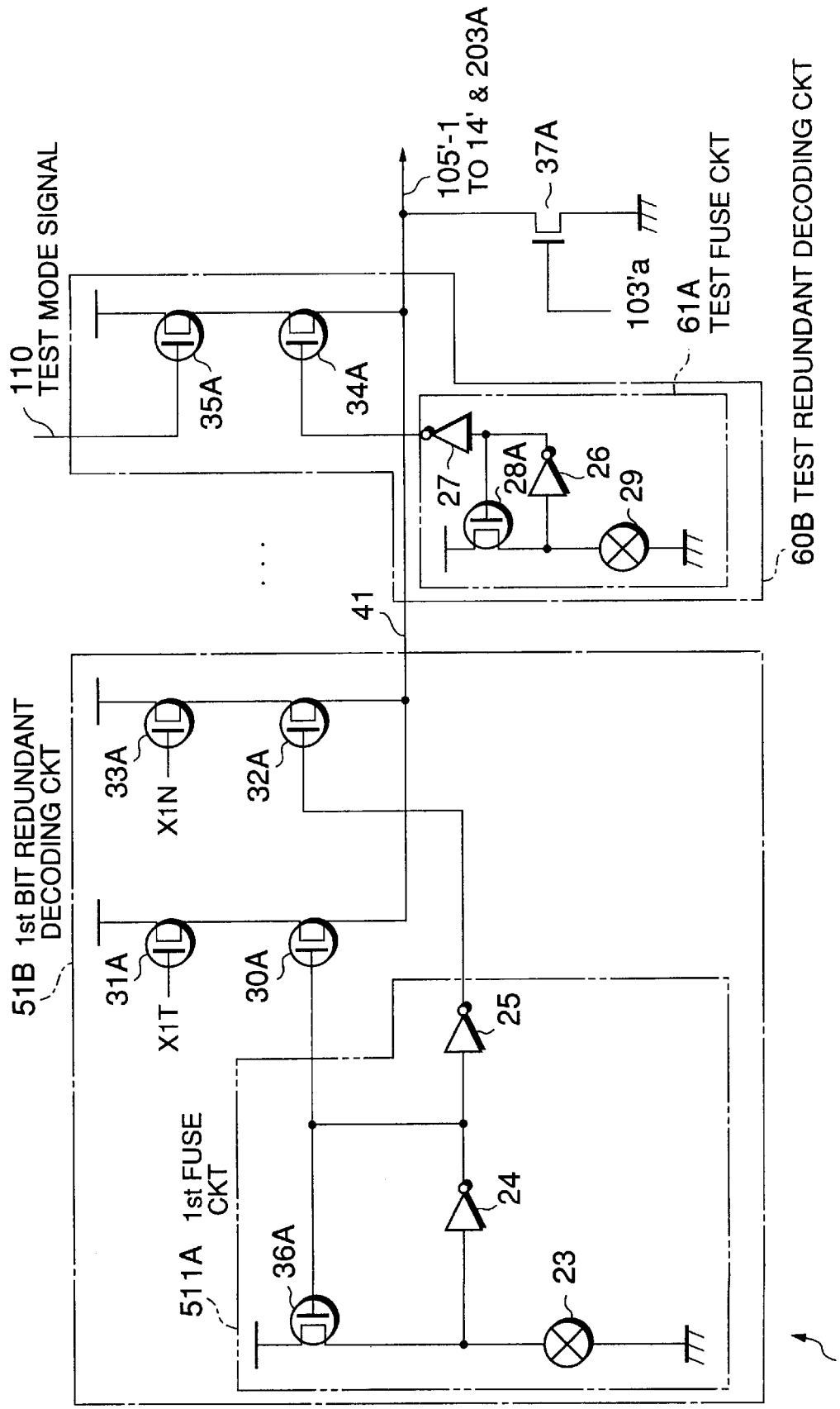
FIG. 13 is a circuit diagram of a redundant decoding circuit for use in the redundant decoder illustrated in FIG. 12.

Referring to FIG. 13, the description will proceed to the first redundant decoding circuit 15C-1 illustrated in FIG. 12. The first redundant decoding circuit 15C-1 comprises a first bit redundant decoding circuits 51B and a test redundant decoding circuit 60B. Although the first redundant decoding circuit 15C-1 further comprises second through eighth bit redundant decoding circuits, illustration thereof is omitted from the figure. This is because each of the second through the eighth bit redundant decoding circuits is similar in structure and operation to the first bit redundant decoding circuit 51B.

The first bit redundant decoding circuit 51B is supplied with the first bit X1T of the row address and the first complementary bit X1N of the complementary row address. The first bit redundant decoding circuit 51B comprises a first fuse circuit 511A and four P-channel MOS transistors 30A, 31A, 32A, and 33A. The first fuse circuit 511A comprises the first fuse-element 23, the two inverters 24 and 25, and a P-channel MOS transistor 36A.

The first fuse-element 23 has an end supplied with a grounding or low-level potential and another end which is connected to an input terminal of the inverter 24 and a drain electrode of the P-channel MOS transistor 36A. The P-channel MOS transistor 36A has a source electrode supplied with a high-level potential and a gate electrode connected to an output terminal of the inverter 24. The output terminal of the inverter 24 is connected to an input terminal of the inverter 25. The output terminal of the inverter 24 in the first fuse circuit 511A produces the first bit fuse output signal. In addition, an output terminal of the inverter 25 in the first fuse circuit 511 produces the first complementary bit fuse output signal.

It will be assumed that the first fuse-element 23 is not fused or not trimmed. In this event, the inverter 24 is supplied with a signal having a logic low level and then the inverter 24 produces the first bit fuse output signal having the logic high level which is indicative of inactive. Inasmuch as the inverter 25 inverts the first bit fuse output signal, the inverter 25 produces the first complementary bit fuse output signal having the logic low level which is indicative of active.

It will be presumed that the first fuse-element 23 is fused or trimmed. In this event, the inverter 24 is supplied with a signal having a logic high level and then the inverter 24 produces the first bit fuse output signal having the logic low level which is indicative of active. The inverter 25 produces the first complementary bit fuse output signal having the logic high level which is indicative of inactive. Responsive to the first bit fuse output signal having the logic low level, the P-channel MOS transistor 36A is turned on to fix the input terminal of the inverter 24 in the logic high level. As a result, operation of the inverter 24 is stabilized.

The P-channel MOS transistor 30A has a drain electrode connected to the common node 41 or the first redundant decoded signal line and a gate electrode supplied with the first bit fuse output signal. The P-channel MOS transistor 31A has a drain electrode connected to a source electrode of the P-channel transistor 30A, a gate electrode supplied with the first bit X1T of the row address, and a source electrode supplied with the high-level potential. The P-channel MOS transistor 32A has a drain electrode connected to the common node 41 and a gate electrode supplied with the first complementary bit fuse output signal. The P-channel MOS transistor 33A has a drain electrode connected to a source electrode of the P-channel MOS transistor 32A, a gate electrode supplied with the first complementary bit X1N of the complementary row address, and a source electrode supplied with the high-level potential.

Supplied with the first bit fuse output signal having the logic low level to the gate electrode of the P-channel MOS transistor 30A, the P-channel MOS transistor 30A is turned on. Supplied with the first bit X1T of the row address having the logic low level to the gate electrode of the P-channel MOS transistor 31A, the P-channel MOS transistor 31A is turned on. When both of the P-channel MOS transistors 30A and 31A are turned on, the common node 41 has a potential of the logic high level. Supplied with the first complementary bit fuse output signal having the logic low level to the gate electrode of the P-channel MOS transistor 32A, the P-channel MOS transistor 32A is turned on. Supplied with the first complementary bit X1N of the complementary row address having the logic low level to the gate electrode of the P-channel MOS transistor 33A, the P-channel MOS transistor 33A is turned on. When both of the P-channel MOS transistors 32A and 33A are turned on, the common node 41 has the potential of the logic high level.

The test redundant decoding circuit 60B is supplied with the test mode signal 110. The test redundant decoding circuit 60B comprises a test fuse circuit 61A and two P-channel MOS transistors 34A and 35A. The test fuse circuit 61A comprises the test fuse-element 29, the two inverters 26 and 27, and a P-channel MOS transistor 28A.

The test fuse-element 29 has an end supplied with the grounding or low-level potential and another end which is connected to an input terminal of the inverter 26 and a drain electrode of the P-channel MOS transistor 28A. The P-channel MOS transistor 28A has a source electrode supplied with the high-level potential and a gate electrode connected to an output terminal of the inverter 26. The output terminal of the inverter 26 is connected to an input terminal of the inverter 27. The inverter 27 in the test fuse circuit 61B has an output terminal for producing a test fuse output signal.

It will be assumed that the test fuse-element 29 is not fused or not trimmed. In this event, the inverter 26 is supplied with the low-level potential having the logic high level and then the inverter 26 produces an output signal having a logic high level. Inasmuch as the inverter 27 inverts the output signal of the inverter 26, the inverter 27 produces the test fuse output signal having the logic low level which is indicative of active.

It will be presumed that the test fuse-element 29 is fused or trimmed. In this event, the inverter 26 is supplied with a signal having the logic high level and then the inverter 26 produces the output signal having tha logic low level. The inverter 27 produces the test fuse output signal having the logic high level which is indicative of inactive. Responsive to the output signal having the logic low level from the inverter 26, the P-channel MOS transistor 28A is turned on to fix the input terminal of the inverter 26 in the logic high level. As a result, operation of the inverter 26 is stabilized.

The P-channel MOS transistor 34A has a drain electrode connected to the common node 41 and a gate electrode supplied with the test fuse output signal. The P-channel MOS transistor 35A has a drain electrode connected to a source electrode of the P-channel transistor 34A, a gate electrode supplied with the test mode signal 110, and a source electrode supplied with the high-level potential.

Supplied with the test fuse output signal having the logic low level to the gate electrode of the P-channel MOS transistor 34A, the P-channel MOS transistor 34A is turned on. In other words, the P-channel MOS transistor 34A is turned on if the test fuse-element 29 is not fused or not trimmed. Supplied with the test mode signal 110 having the logic low level to the gate electrode of the P-channel MOS transistor 35A, the P-channel MOS transistor 35A is turned on. When both of the P-channel MOS transistors 34A and 35A are turned on, the common node 41 has the potential of the logic high level.

The first redundant decoding circuit 15C-1 further comprises an N-channel MOS transistor 37A. The N-channel MOS transistor 37A has a source electrode supplied with the grounding or low-level potential, a gate electrode supplied with the first control signal 103'a, and a drain electrode connected to the common node 41. Supplied with the first control signal 103'a having the logic high level to the gate electrode of the N-channel MOS transistor 37A, the P-channel MOS transistor is turned on to make the common node 41 the logic low level. That is, the N-channel MOS transistor 37A acts as a discharging arrangement for discharging the first redundant decoded signal line 41 with the low-level potential on carrying out a test of the first row of the redundant memory cell array 14' before replacement.

With this structure, all of the first through the eighth bits X1T to X8T of the row address are set with the logic low level, namely, "0000 0000" in a case of carrying out a test of the first row in the redundant memory cell array 14' before replacement. In this event, all of the first through the eighth complementary bits X1N to X8N of the complementary row address justly become the logic high level, namely, "1111 1111". In addition, the first redundant decoding circuit 15C-1 produces the first redundant decoded signal 105'-1 having the logic low level which is indicative of active.

Figure 14:
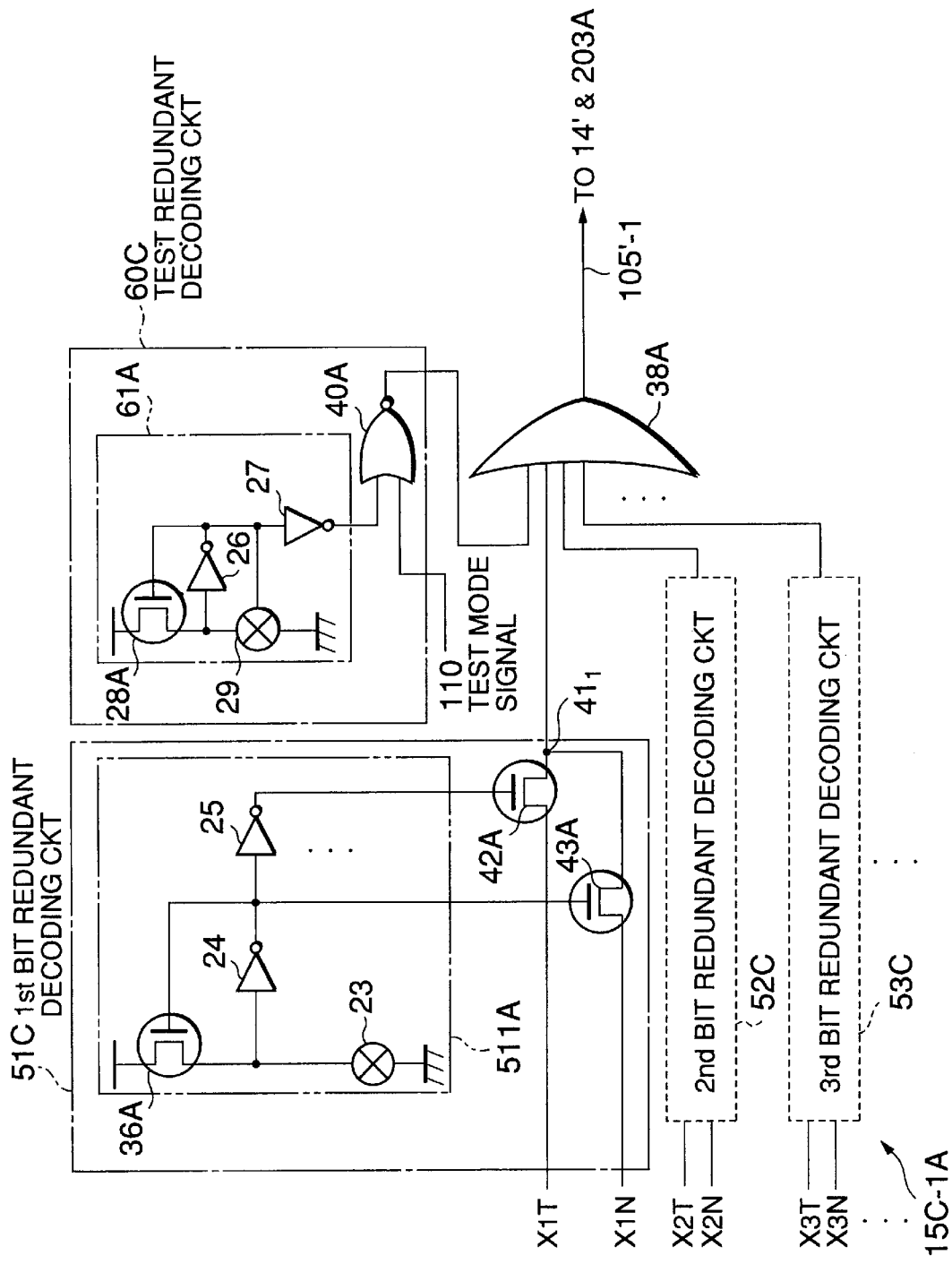
FIG. 14 is a circuit diagram of another redundant decoding circuit for use in the redundant decoder illustrated in FIG. 12.

Referring to FIG. 14, the description will proceed to another redundant decoding circuit for use in the redundant decoder 15C. FIG. 14 shows only a first redundant decoding circuit 15C-1A. This is because each of a second redundant decoding circuit, a third redundant decoding circuit, . . . , and so on is similar in structure and operation to the first redundant decoding circuit 15C-1A.

The first redundant decoding circuit 15C-1A comprises first through eighth bit redundant decoding circuits 51C, 52C, 53C, . . . , and so on, a test redundant decoding circuit 60C, and an OR circuit 38A. Illustration of the second through the eighth bit redundant decoding circuits 52C, 53C, . . . , and so on is omitted from the figure. This is because each of the second through the eighth bit redundant decoding circuits 52C, 53C, . . . , and so on is similar in structure and operation to the first bit redundant decoding circuit 51C.

The first bit redundant decoding circuit 51C is similar in structure and operation to the first bit redundant decoding circuit 51B illustrated in FIG. 13 except that the first bit redundant decoding circuit 51C comprises two P-channel MOS transistors 42A and 43A in lieu of the four P-channel MOS transistors 30A, 31A, 32A, and 33A.

The first bit redundant decoding circuit 51C has a first bit redundant output node $41_1$ for supplying the OR circuit 38A with a first bit redundant decoded signal indicative of active at the logic low level. The P-channel MOS transistor 42A has a drain electrode connected to the first bit redundant output node $41_1$, a gate electrode supplied with the first complementary bit fuse output signal, and a source electrode supplied with the first bit X1T of the row address. The P-channel MOS transistor 43A has a drain electrode connected to the first bit redundant output node $41_1$, a gate electrode supplied with the first bit fuse output signal, and a source electrode supplied with the first complementary bit X1N of the complementary row address.

Supplied with the first complementary bit fuse output signal having the logic low level to the gate electrode of the P-channel MOS transistor 42A, the P-channel MOS transistor 42A is turned on to supply the first bit X1T of the row address from the first bit redundant output node $41_1$ to an input terminal of the OR circuit 38A. Supplied with the first bit fuse output signal having the logic low level to the gate electrode of the P-channel MOS transistor 43A, the P-channel MOS transistor 43A is turned on to supply the first complementary bit X1N of the complementary row address from the first bit redundant output node 41$_1$ to the input terminal of the OR circuit 38A.

Likewise, the second through the eighth bit redundant decoding circuits 52C, 53C, ..., and so on produce second through eighth bit redundant decoded signals which are supplied to respective input terminals of the OR circuit 38A.

The test redundant decoding circuit 60C is similar in structure and operation to the test redundant decoding circuit 60B illustrated in FIG. 13 except that the test redundant decoding circuit 60C comprises a NOR circuit 40A in place of the two P-channel MOS transistors 34A and 35A.

The NOR circuit 40A has an input terminal supplied with the test fuse output signal and another input terminal supplied with the test mode signal 110. The NOR circuit 40A has an output terminal connected to another input terminal of the OR circuit 38A. The NOR circuit 40A computes the NOR of the test fuse output signal with the test mode signal 110 to produce a NORed signal as a test redundant decoded signal which is supplied to the other terminal of the OR circuit 38A. That is, the NOR circuit 40A is operable as a combining arrangement for combining the test fuse output signal with the test mode signal 110 to produce a combined signal as the test redundant decode signal.

The OR circuit 38A computes the OR of the test redundant decoded signal and the first through the eighth bit redundant decoded signals to produce an ORed signal as the first redundant decoded signal 105'-1.

With this structure, all of the first through the eighth bits X1T to X8T of the row address are also set with the logic low level, namely, "0000 0000" in a case of carrying out a test of the first row in the redundant memory cell array 14' before replacement. In addition, the first redundant decoding circuit 15C-1A also produces the first redundant decoded signal 105'-1 having the logic low level which is indicative of active.

While this invention has thus far been described in conjunction with a few preferred embodiments thereof, it will now be readily possible for those skilled in the art to put this invention into various other manners. For example, the row address is not restricted to eight bits in length. In addition, the rows and the columns may be changed to each other in the regular memory cell array and the redundant memory cell array. Under the circumstances, the redundant decoder serves as a spare column decoder supplied with a column address and a complementary column address in place of the row address and the complementary row address. Under the circumstances, each column of the redundant memory cell array carries out a substitute operation by replacing a defective one of columns of the regular memory cell array that is diagnosed as a defective column. Furthermore, the redundant decoder may be a spare decoder supplied with the address signal and the complementary address signal. In this event, each redundant memory cell of the redundant memory cell array carries out a substitute operation by replacing a defective one of the regular memory cells of the regular memory cell array that is diagnosed as a defective memory cell.

What is claimed is:

1. A semiconductor memory device comprising:
   a regular memory cell array comprising a plurality of regular memory cells which are arranged in the configuration of a matrix with first through M-th rows and first through N-th columns where M and N represent first and second positive integers each of which is not less than two;
   a regular decoder, connected to said regular memory cell array and supplied with a decode inhibit signal, an address signal, and a complementary address signal having a logical value which is reverse of that of the address signal, for decoding the address signal and the complementary address signal into a regular decoded signal for activating one of the regular memory cells when the decode inhibit signal is indicative of inactive;
   a redundant memory cell array comprising a plurality of redundant memory cells which are arranged in the configuration of a matrix with first through P-th rows and the first through the N-th columns where P represents a third positive integer which is not less than two, each of the first through the P-th rows of said redundant memory cell array carrying out a substitute operation by replacing a defective one of the first through the M-th rows of said regular memory cell array that is diagnosed as a defective row; and
   a redundant decoder connected to said redundant memory cell array and the regular decoder and supplied with a test mode signal, said redundant decoder comprising first through P-th redundant decoding circuits connected to the first through the P-th rows of said redundant memory cell array, respectively, each of said first through said P-th redundant decoding circuits being supplied with a row address in the address signal, a complementary row address in the complementary address signal, and the test mode signal, a p-th redundant decoding circuit being set with a p-th redundant row address which is identical with an address for the defective row of said regular memory cell array, where p represents each of 1 through P, said p-th redundant decoding circuit supplying a p-th row of said redundant memory cell array with a p-th redundant decoded signal for activating the p-th row of said redundant memory cell array when said p-th redundant decoding circuit is supplied with the row address and the complementary row address which are indicative of the p-th redundant row address, said first through said P-th redundant decoding circuits being supplied with the row address of the address signal and the complementary row address of the complementary address signal in different order so that at least one pair of a bit in the row address and a corresponding bit in the complementary row address is supplied in the reverse sequence, said redundant decoder further comprising a decode inhibit signal producing means, connected between said first through said P-th redundant decoding circuits and said regular decoder, for producing the decode inhibit signal indicative of active when any one of the first through the P-th redundant decoded signals is indicative of active.

2. A semiconductor memory device as claimed in claim 1, said decode inhibit signal producing means being an OR gate for producing the decode inhibit signal indicative of active at a logic high level, said p-th redundant decoding circuit producing the p-th redundant decoded signal via a p-th redundant decoded signal line, wherein said p-th redundant decoding circuit comprising:
   charging means for charging the p-th redundant decoded signal line with a high-level potential on carrying out a test of the p-th row of said redundant memory cell array before replacement; and
   a test redundant decoding circuit supplied with the test mode signal indicative of active at a logic low level, said test redundant decoding circuit comprising a test fuse circuit including a test fuse-element having an end supplied with the high-level potential, said test fuse circuit producing a test fuse output signal indicative of active at the logic high level when the test fuse-element is not fused.

3. A semiconductor memory device as claimed in claim 2, wherein said charging means is a P-channel MOS transistor having a source electrode supplied with the high-level potential, a drain electrode connected to the p-th redundant decoded signal line, and a gate electrode supplied with a control signal indicative of active at the logic low level.

4. A semiconductor memory device as claimed in claim 2, wherein said test redundant decoding circuit further comprising:

first switching means having a first primary main electrode connected to the p-th redundant decoded signal line a first control electrode supplied with the test fuse output signal, and a first subsidiary main electrode, said first switching means being turned on in response to the test fuse output signal indicative of active; and second switching means having a second primary main electrode connected to the first subsidiary main electrode of said first switching means, a second control electrode supplied with the test mode signal, and a second subsidiary main electrode supplied with the low-level potential, said second switching means being turned on in response to the test mode signal indicative of inactive.

5. A semiconductor memory device as claimed in claim 4, wherein said first switching means is a first N-channel MOS transistor having a first drain electrode as the first primary main electrode, a first gate electrode as the first control electrode, and a first source electrode as the first subsidiary main electrode, said second switching means is a second N-channel MOS transistor having a second drain electrode as the second primary main electrode, a second gate electrode as the second control electrode, and a second source electrode as the second subsidiary main electrode.

6. A semiconductor memory device as claimed in claim 2, wherein said test fuse circuit further comprises:

an N-channel MOS transistor having a drain electrode connected to another end of said test fuse-element and a source electrode supplied with the low-level potential;

a first inverter having an input terminal connected to the other end of the said test fuse-element and the drain electrode of said N-channel MOS transistor, said first inverter having an output terminal connected to a gate electrode of said N-channel MOS transistor; and a second inverter having an input terminal connected to the output terminal of said first inverter, said second inverter inverting an output signal of said first inverter to produce the test fuse output signal.

7. A semiconductor memory device as claimed in claim 2, the row address consisting of first through Q-th bits while the complementary row address consists of first through Q-th complementary bits where Q represents a fourth positive integer which is not less than two, said third positive integer P being not more than $2^Q$, wherein said p-th redundant decoding circuit further comprises:

first through Q-th bit redundant decoding circuits connected to the p-th redundant decoded signal line, a q-th bit redundant decoding circuit being supplied with a q-th bit of the row address and a q-th complementary bit of the complementary row address, where q represents each of 1 through Q, said q-th bit redundant decoding circuit comprising a q-th fuse circuit including a q-th bit fuse-element having an end supplied with the high-level potential, said q-th fuse circuit producing a q-th bit fuse output signal indicative of inactive at the logic low level and a q-th complementary bit fuse output signal indicative of active at the logic high level when said q-th bit fuse-element is not fused.

8. A semiconductor memory device as claimed in claim 7, wherein said q-th bit redundant decoding circuit further comprises:

first switching means having a first primary main electrode connected to the p-th redundant decoded signal line, a first control electrode supplied with the q-th bit fuse output signal, and a first subsidiary main electrode, said first switching means being turned off in response to the q-th bit fuse output signal indicative of inactive;

second switching means having a second primary main electrode connected to the first subsidiary main electrode of said first switching means, a second control electrode supplied with one of the q-th bit of the row address and the q-th complementary bit of the complementary row address, and a second subsidiary main electrode supplied with the low-level potential, said second switching means being turned on when said one of the q-th bit of the row address and the q-th complementary bit of the complementary row address indicates the logic high level;

third switching means having a third primary main electrode connected to the p-th redundant decoded signal line a third control electrode supplied with the q-th complementary bit fuse output signal, and a third subsidiary main electrode, said third switching means being turned on in response to the q-th complementary bit fuse output signal indicative of active; and fourth switching means having a fourth primary main electrode connected to the third subsidiary main electrode of said third switching means, a fourth control electrode supplied with another of the q-th bit of the row address and the q-th complementary bit of the complementary row address, and a fourth subsidiary main electrode supplied with the low-level potential, said fourth switching means being turned off when said other of the q-th bit of the row address and the q-th complementary bit of the complementary row address indicates the logic low level.

9. A semiconductor memory device as claimed in claim 8, wherein said first switching means is a first N-channel MOS transistor having a first drain electrode as the first primary main electrode, a first gate electrode as the first control electrode, and a first source electrode as the first subsidiary main electrode, said second switching means being a second N-channel MOS transistor having a second drain electrode as the second primary main electrode, a second gate electrode as the second control electrode, and a second source electrode as the second subsidiary main electrode, said third switching means being a third N-channel MOS transistor having a third drain electrode as the third primary main electrode, a third gate electrode as the third control electrode, and a third source electrode as the first subsidiary main electrode, said fourth switching means being a fourth N-channel MOS transistor having a fourth drain electrode as the fourth primary main electrode, a fourth gate electrode as the fourth control electrode, and a fourth source electrode as the fourth subsidiary main electrode.

10. A semiconductor memory device as claimed in claim 7, wherein said q-th fuse circuit further comprises:

an N-channel MOS transistor having a drain electrode connected to another end of said q-th bit fuse-element and a source electrode supplied with the low-level potential;

a first inverter having an input terminal connected to the other end of the said test fuse-element and the drain electrode of said N-channel MOS transistor, said first inverter having an output terminal connected to a gate electrode of said N-channel MOS transistor, said first inverter producing the q-th bit fuse output signal; and a second inverter having an input terminal connected to the output terminal of said first inverter, said second inverter inverting the q-th bit fuse output signal to produce the q-th complementary bit fuse output signal.

11. A semiconductor memory device as claimed in claim 1, said decode inhibit signal producing means being an OR gate for producing the decode inhibit signal indicative of active at a logic high level, said p-th redundant decoding circuit producing the p-th redundant decoded signal via an AND circuit, wherein said p-th redundant decoding circuit comprising a test redundant decoding circuit supplied with the test mode signal indicative of active at a logic low level, said test redundant decoding circuit comprising a test fuse circuit including a test fuse-element having an end supplied with a high-level potential, said test fuse circuit producing a test fuse output signal indicative of active at the logic high level when the test fuse-element is not fused, said test redundant decoding circuit supplying said AND circuit with a test redundant decoded signal indicative of active at the logic high level.

12. A semiconductor memory device as claimed in claim 11, wherein said test redundant decoding circuit further comprising combining means, connected to said test fuse circuit and supplied with the test mode signal, for combining the test fuse output signal with the test mode signal to produce a combined signal as the test redundant decoded signal.

13. A semiconductor memory device as claimed in claim 12, wherein said combining means is a NAND circuit for computes the NAND of the test fuse output signal with the test mode signal to produce a NANDed signal as the combined signal.

14. A semiconductor memory device as claimed in claim 11, wherein said test fuse circuit further comprises:

an N-channel MOS transistor having a drain electrode connected to another end of said test fuse-element and a source electrode supplied with the low-level potential;

a first inverter having an input terminal connected to the other end of the said test fuse-element and the drain electrode of said N-channel MOS transistor, said first inverter having an output terminal connected to a gate electrode of said N-channel MOS transistor; and a second inverter having an input terminal connected to the output terminal of said first inverter, said second inverter inverting an output signal of said first inverter to produce the test fuse output signal.

15. A semiconductor memory device as claimed in claim 11, the row address consisting of first through Q-th bits while the complementary row address consists of first through Q-th complementary bits where Q represents a fourth positive integer which is not less than two, said third positive integer P being not more than $2^Q$, wherein said p-th redundant decoding circuit further comprises:

first through Q-th bit redundant decoding circuits connected to input terminals of the AND circuit, a q-th bit redundant decoding circuit being supplied with a q-th bit of the row address and a q-th complementary bit of the complementary row address, where q represents each of 1 through Q, said q-th bit redundant decoding circuit comprising a q-th fuse circuit including a q-th bit fuse-element having an end supplied with the high-level potential, said q-th fuse circuit producing a q-th bit fuse output signal indicative of inactive at the logic low level and a q-th complementary bit fuse output signal indicative of active at the logic high level when said q-th bit fuse-element is not fused, said q-th bit redundant decoding circuit having a q-th bit redundant output node for supplying said AND circuit with a q-th bit redundant decoded signal indicative of active at the logic high level.

16. A semiconductor memory device as claimed in claim 15, wherein said q-th bit redundant decoding circuit further comprises:

first switching means having a first primary main electrode connected to the q-th bit redundant output node, a first control electrode supplied with the q-th complementary bit fuse output signal, and a first subsidiary main electrode supplied with one of the q-th bit of the row address and the q-th complementary bit of the complementary row address, said first switching means being turned on in response to the q-th complementary bit fuse output signal indicative of active; and second switching means having a second primary main electrode connected to the q-th bit redundant output node, a second control electrode supplied with the q-th bit fuse output signal, and a second subsidiary main electrode supplied with another of the q-th bit of the row address and the q-th complementary bit of the complementary row address, said second switching means being turned off in response to the q-th bit fuse output signal indicative of inactive.

17. A semiconductor memory device as claimed in claim 16, wherein said first switching means is a first N-channel MOS transistor having a first drain electrode as the first primary main electrode, a first gate electrode as the first control electrode, and a first source electrode as the first subsidiary main electrode, and said second switching means being a second N-channel MOS transistor having a second drain electrode as the second primary main electrode, a second gate electrode as the second control electrode, and a second source electrode as the second subsidiary main electrode.

18. A semiconductor memory device as claimed in claim 15, wherein said q-th fuse circuit further comprises:

an N-channel MOS transistor having a drain electrode connected to another end of said q-th bit fuse-element and a source electrode supplied with the low-level potential;

a first inverter having an input terminal connected to the other end of the said test fuse-element and the drain electrode of said N-channel MOS transistor, said first inverter having an output terminal connected to a gate electrode of said N-channel MOS transistor, said first inverter producing the q-th bit fuse output signal; and a second inverter having an input terminal connected to the output terminal of said first inverter, said second inverter inverting the q-th bit fuse output signal to produce the q-th complementary bit fuse output signal.

19. A semiconductor memory device as claimed in claim 1, said p-th redundant decoding circuit producing the p-th redundant decoded signal via a p-th redundant decoded signal line, said decode inhibit signal producing means being an AND gate for producing the decode inhibit signal indicative of active at a logic low level, wherein said p-th redundant decoding circuit comprising:

discharging means for discharging the p-th redundant decoded signal line with a low-level potential on carrying out a test of the p-th row of said redundant memory cell array before replacement; and a test redundant decoding circuit supplied with the test mode signal indicative of active at a logic high level, said test redundant decoding circuit comprising a test fuse circuit including a test fuse-element having an end supplied with the low-level potential, said test fuse circuit producing a test fuse output signal indicative of active at the logic low level when the test fuse-element is not fused.

20. A semiconductor memory device as claimed in claim 19, wherein said discharging means is an N-channel MOS transistor having a source electrode supplied with the low-level potential, a drain electrode connected to the p-th redundant decoded signal line, and a gate electrode supplied with a control signal indicative of active at the logic high level.

21. A semiconductor memory device as claimed in claim 19, wherein said test redundant decoding circuit further comprising:

first switching means having a first primary main electrode connected to the p-th redundant decoded signal line a first control electrode supplied with the test fuse output signal, and a first subsidiary main electrode, said first switching means being turned on in response to the test fuse output signal, indicative of active; and second switching means having a second primary main electrode connected to the first subsidiary main electrode of said first switching means, a second control electrode supplied with the test mode signal, and a second subsidiary main electrode supplied with the high-level potential, said second switching means being turned on in response to the test mode signal indicative of inactive.

22. A semiconductor memory device as claimed in claim 21, wherein said first switching means is a first P-channel MOS transistor having a first drain electrode as the first primary main electrode, a first gate electrode as the first control electrode, and a first source electrode as the first subsidiary main electrode, said second switching means is a second P-channel MOS transistor having a second drain electrode as the second primary main electrode, a second gate electrode as the second control electrode, and a second source electrode as the second subsidiary main electrode.

23. A semiconductor memory device as claimed in claim 19, wherein said test fuse circuit further comprises:

a P-channel MOS transistor having a drain electrode connected to another end of said test fuse-element and a source electrode supplied with the high-level potential;

a first inverter having an input terminal connected to the other end of the said test fuse-element and the drain electrode of said P-channel MOS transistor, said first inverter having an output terminal connected to a gate electrode of said P-channel MOS transistor; and a second inverter having an input terminal connected to the output terminal of said first inverter, said second inverter inverting an output signal of said first inverter to produce the test fuse output signal.

24. A semiconductor memory device as claimed in claim 19, the row address consisting of first through Q-th bits while the complementary row address consists of first through Q-th complementary bits where Q represents a fourth positive integer which is not less than two, said third positive integer P being not more than $2^Q$, wherein said p-th redundant decoding circuit further comprises:

first through Q-th bit redundant decoding circuits connected to the p-th redundant decoded signal line, a q-th bit redundant decoding circuit being supplied with a q-th bit of the row address and a q-th complementary bit of the complementary row address, where q represents each of 1 through Q, said q-th bit redundant decoding circuit comprising a q-th fuse circuit including a q-th bit fuse-element having an end supplied with the low-level potential, said q-th fuse circuit producing a q-th bit fuse output signal indicative of inactive at the logic high level and a q-th complementary bit fuse output signal indicative of active at the logic low level when said q-th bit fuse-element is not fused.

25. A semiconductor memory device as claimed in claim 24, wherein said q-th bit redundant decoding circuit further comprises:

first switching means having a first primary main electrode connected to the p-th redundant decoded signal line, a first control electrode supplied with the q-th bit fuse output signal, and a first subsidiary main electrode, said first switching means being turned off in response to the q-th bit fuse output signal indicative of inactive;

second switching means having a second primary main electrode connected to the first subsidiary main electrode of said first switching means, a second control electrode supplied with one of the q-th bit of the row address and the q-th complementary bit of the complementary row address, and a second subsidiary main electrode supplied with the high-level potential, said second switching means being turned on when said one of the q-th bit of the row address and the q-th complementary bit of the complementary row address indicates the logic low level;

third switching means having a third primary main electrode connected to the p-th redundant decoded signal line a third control electrode supplied with the q-th complementary bit fuse output signal, and a third subsidiary main electrode, said third switching means being turned on in response to the q-th complementary bit fuse output signal indicative of active; and fourth switching means having a fourth primary main electrode connected to the third subsidiary main electrode of said third switching means, a fourth control electrode supplied with another of the q-th bit of the row address and the q-th complementary bit of the complementary row address, and a fourth subsidiary main electrode supplied with the high-level potential, said fourth switching means being turned off when said other of the q-th bit of the row address and the q-th complementary bit of the complementary row address indicates the logic high level.

26. A semiconductor memory device as claimed in claim 25, wherein said first switching means is a first P-channel MOS transistor having a first drain electrode as the first primary main electrode, a first gate electrode as the first control electrode, and a first source electrode as the first subsidiary main electrode, said second switching means being a second P-channel MOS transistor having a second drain electrode as the second primary main electrode, a second gate electrode as the second control electrode, and a second source electrode as the second subsidiary main electrode, said third switching means being a third P-channel MOS transistor having a third drain electrode as the third primary main electrode, a third gate electrode as the third control electrode, and a third source electrode as the first subsidiary main electrode, said fourth switching means being a fourth P-channel MOS transistor having a fourth drain electrode as the fourth primary main electrode, a fourth gate electrode as the fourth control electrode, and a fourth source electrode as the fourth subsidiary main electrode.

27. A semiconductor memory device as claimed in claim 24, wherein said q-th fuse circuit further comprises:

a P-channel MOS transistor having a drain electrode connected to another end of said q-th bit fuse-element and a source electrode supplied with the high-level potential;

a first inverter having an input terminal connected to the other end of the said test fuse-element and the drain electrode of said P-channel MOS transistor, said first inverter having an output terminal connected to a gate electrode of said P-channel MOS transistor, said first inverter producing the q-th bit fuse output signal; and a second inverter having an input terminal connected to the output terminal of said first inverter, said second inverter inverting the q-th bit fuse output signal to produce the q-th complementary bit fuse output signal.

28. A semiconductor memory device as claimed in claim 1, said decode inhibit signal producing means being an AND gate for producing the decode inhibit signal indicative of active at a logic low level, said p-th redundant decoding circuit producing the p-th redundant decoded signal via an OR circuit, wherein said p-th redundant decoding circuit comprising a test redundant decoding circuit supplied with the test mode signal indicative of active at a logic high level, said test redundant decoding circuit comprising a test fuse circuit including a test fuse-element having an end supplied with a low-level potential, said test fuse circuit producing a test fuse output signal indicative of active at the logic low level when the test fuse-element is not fused, said test redundant decoding circuit supplying said AND circuit with a test redundant decoded signal indicative of active at the logic low level.

29. A semiconductor memory device as claimed in claim 28, wherein said test redundant decoding circuit further comprising combining means, connected to said test fuse circuit and supplied with the test mode signal, for combining the test fuse output signal with the test mode signal to produce a combined signal as the test redundant decoded signal.

30. A semiconductor memory device as claimed in claim 29, wherein said combining means is a NOR circuit for computes the NOR of the test fuse output signal with the test mode signal to produce a NORed signal as the combined signal.

31. A semiconductor memory device as claimed in claim 28, wherein said test fuse circuit further comprises:

a P-channel MOS transistor having a drain electrode connected to another end of said test fuse-element and a source electrode supplied with the high-level potential;

a first inverter having an input terminal connected to the other end of the said test fuse-element and the drain electrode of said P-channel MOS transistor, said first inverter having an output terminal connected to a gate electrode of said P-channel MOS transistor; and a second inverter having an input terminal connected to the output terminal of said first inverter, said second inverter inverting an output signal of said first inverter to produce the test fuse output signal.

32. A semiconductor memory device as claimed in claim 28, the row address consisting of first through Q-th bits while the complementary row address consists of first through Q-th complementary bits where Q represents a fourth positive integer which is not less than two, said third positive integer P being not more than $2^Q$, wherein said p-th redundant decoding circuit further comprises:

first through Q-th bit redundant decoding circuits connected to input terminals of the OR circuit, a q-th bit redundant decoding circuit being supplied with a q-th bit of the row address and a q-th complementary bit of the complementary row address, where q represents each of 1 through Q, said q-th bit redundant decoding circuit comprising a q-th fuse circuit including a q-th bit fuse-element having an end leg supplied with the low-level potential, said q-th fuse circuit producing a q-th bit fuse output signal indicative of inactive at the logic high level and a q-th complementary bit fuse output signal indicative of active at the logic low level when said q-th bit fuse-element is not fused, said q-th bit redundant decoding circuit having a q-th bit redundant output node for supplying said OR circuit with a q-th bit redundant decoded signal indicative of active at the logic low level.

33. A semiconductor memory device as claimed in claim 32, wherein said q-th bit redundant decoding circuit further comprises:

first switching means having a first primary main electrode connected to the q-th bit redundant output node, a first control electrode supplied with the q-th complementary bit fuse output signal, and a first subsidiary main electrode supplied with one of the q-th bit of the row address and the q-th complementary bit of the complementary row address, said first switching means being turned on in response to the q-th complementary bit fuse output signal indicative of active; and second switching means having a second primary main electrode connected to the q-th bit redundant output node, a second control electrode supplied with the q-th bit fuse output signal, and a second subsidiary main electrode supplied with another of the q-th bit of the row address and the q-th complementary bit of the complementary row address, said second switching means being turned off in response to the q-th bit fuse output signal indicative of inactive.

34. A semiconductor memory device as claimed in claim 33, wherein said first switching means is a first P-channel MOS transistor having a first drain electrode as the first primary main electrode, a first gate electrode as the first control electrode, and a first source electrode as the first subsidiary main electrode, and said second switching means being a second P-channel MOS transistor having a second drain electrode as the second primary main electrode, a second gate electrode as the second control electrode, and a second source electrode as the second subsidiary main electrode.

35. A semiconductor memory device as claimed in claim 32, wherein said q-th fuse circuit further comprises:

a P-channel MOS transistor having a drain electrode connected to another end of said q-th bit fuse-element and a source electrode supplied with the high-level potential;

a first inverter having an input terminal connected to the other end of the said test fuse-element and the drain electrode of said N-channel MOS transistor, said first inverter having an output terminal connected to a gate electrode of said P-channel MOS transistor, said first inverter producing the q-th bit fuse output signal; and a second inverter having an input terminal connected to the output terminal of said first inverter, said second inverter inverting the q-th bit fuse output signal to produce the q-th complementary bit fuse output signal.

36. A semiconductor memory device comprising:

a regular memory cell array comprising a plurality of regular memory cells which are arranged in the configuration of a matrix with first through M-th rows and first through N-th columns where M and N represent first and second positive integers each of which is not less than two;

a regular decoder, connected to said regular memory cell array and supplied with a decode inhibit signal, an address signal, and a complementary address signal having a logical value which is reverse of that of the address signal, for decoding the address signal and the complementary address signal into a regular decoded signal for activating one of the regular memory cells when the decode inhibit signal is indicative of inactive;

a redundant memory cell array comprising a plurality of redundant memory cells which are arranged in the configuration of a matrix with first through M-th rows and the first through the P-th columns where P represents a third positive integer which is not less than two, each of the first through the P-th columns of said redundant memory cell array carrying out a substitute operation by replacing a defective one of the first through the M-th columns of said regular memory cell array that is diagnosed as a defective column; and a redundant decoder connected to said redundant memory cell array and said regular decoder and supplied with a test mode signal, said redundant decoder comprising first through P-th redundant decoding circuits connected to the first through the P-th rows of said redundant memory cell array, respectively, each of said first through said P-th redundant decoding circuits being supplied with a column address in the address signal, a complementary column address in the complementary address signal, and the test mode signal, a p-th redundant decoding circuit being set with a p-th redundant column address which is identical with an address for the defective column of said regular memory cell array, where p represents each of 1 through P, said p-th redundant decoding circuit supplying a p-th column of said redundant memory cell array with a p-th redundant decoded signal for activating the p-th column of said redundant memory cell array when said p-th redundant decoding circuit is supplied with the column address and the complementary column address which are indicative of the p-th redundant column address, said first through said P-th redundant decoding circuits being supplied with the column address of the address signal and the complementary column address of the complementary address signal in different order so that at least one pair of a bit in the column address and a corresponding bit in the complementary column address is supplied in the reverse sequence, said redundant decoder further comprising a decode inhibit signal producing means, connected between said first through said P-th redundant decoding circuits and said regular decoder, for producing the decode inhibit signal indicative of active when any one of the first through the P-th redundant decoded signals is indicative of active.

37. A semiconductor memory device as claimed in claim 36, said decode inhibit signal producing means being an OR gate for producing the decode inhibit signal indicative of active at a logic high level, said p-th redundant decoding circuit producing the p-th redundant decoded signal via a p-th redundant decoded signal line, wherein said p-th redundant decoding circuit comprising:

charging means for charging the p-th redundant decoded signal line with a high-level potential on carrying out a test of the p-th column of said redundant memory cell array before replacement; and a test redundant decoding circuit supplied with the test mode signal indicative of active at a logic low level, said test redundant decoding circuit comprising a test fuse circuit including a test fuse-element having an end supplied with the high-level potential, said test fuse circuit producing a test fuse output signal indicative of active at the logic high level when the test fuse-element is not fused.

38. A semiconductor memory device as claimed in claim 37, wherein said charging means is a P-channel MOS transistor having a source electrode supplied with the high-level potential, a drain electrode connected to the p-th redundant decoded signal line, and a gate electrode supplied with a control signal indicative of active at the logic low level.

39. A semiconductor memory device as claimed in claim 37, wherein said test redundant decoding circuit further comprising:

first switching means having a first primary main electrode connected to the p-th redundant decoded signal line a first control electrode supplied with the test fuse output signal, and a first subsidiary main electrode, said first switching means being turned on in response to the test fuse output signal indicative of active; and second switching means having a second primary main electrode connected to the first subsidiary main electrode of said first switching means, a second control electrode supplied with the test mode signal, and a second subsidiary main electrode supplied with the low-level potential, said second switching means being turned on in response to the test mode signal indicative of inactive.

40. A semiconductor memory device as claimed in claim 39, wherein said first switching means is a first N-channel MOS transistor having a first drain electrode as the first primary main electrode, a first gate electrode as the first control electrode, and a first source electrode as the first subsidiary main electrode, said second switching means is a second N-channel MOS transistor having a second drain electrode as the second primary main electrode, a second gate electrode as the second control electrode, and a second source electrode as the second subsidiary main electrode.

41. A semiconductor memory device as claimed in claim 37, wherein said test fuse circuit further comprises:

an N-channel MOS transistor having a drain electrode connected to another end of said test fuse-element and a source electrode supplied with the low-level potential;

a first inverter having an input terminal connected to the other end of the said test fuse-element and the drain electrode of said N-channel MOS transistor, said first inverter having an output terminal connected to a gate electrode of said N-channel MOS transistor; and a second inverter having an input terminal connected to the output terminal of said first inverter, said second inverter inverting an output signal of said first inverter to produce the test fuse output signal.

42. A semiconductor memory device as claimed in claim 37, the column address consisting of first through Q-th bits while the complementary column address consists of first through Q-th complementary bits where Q represents a fourth positive integer which is not less than two, said third positive integer P being not more than $2^Q$, wherein said p-th redundant decoding circuit further comprises:

first through Q-th bit redundant decoding circuits connected to the p-th redundant decoded signal line, a q-th bit redundant decoding circuit being supplied with a q-th bit of the column address and a q-th complementary bit of the complementary column address, where q represents each of 1 through Q, said q-th bit redundant decoding circuit comprising a q-th fuse circuit including a q-th bit fuse-element having an end supplied with the high-level potential, said q-th fuse circuit producing a q-th bit fuse output signal indicative of inactive at the logic low level and a q-th complementary bit fuse output signal indicative of active at the logic high level when said q-th bit fuse-element is not fused.

43. A semiconductor memory device as claimed in claim 42, wherein said q-th bit redundant decoding circuit further comprises:

first switching means having a first primary main electrode connected to the p-th redundant decoded signal line, a first control electrode supplied with the q-th bit fuse output signal, and a first subsidiary main electrode, said first switching means being turned off in response to the q-th bit fuse output signal indicative of inactive;

second switching means having a second primary main electrode connected to the first subsidiary main electrode of said first switching means, a second control electrode supplied with one of the q-th bit of the column address and the q-th complementary bit of the complementary column address, and a second subsidiary main electrode supplied with the low-level potential, said second switching means being turned on when said one of the q-th bit of the column address and the q-th complementary bit of the complementary column address indicates the logic high level;

third switching means having a third primary main electrode connected to the p-th redundant decoded signal line a third control electrode supplied with the q-th complementary bit fuse output signal, and a third subsidiary main electrode, said third switching means being turned on in response to the q-th complementary bit fuse output signal indicative of active; and fourth switching means having a fourth primary main electrode connected to the third subsidiary main electrode of said third switching means, a fourth control electrode supplied with another of the q-th bit of the column address and the q-th complementary bit of the complementary column address, and a fourth subsidiary main electrode supplied with the low-level potential, said fourth switching means being turned off when said other of the q-th bit of the column address and the q-th complementary bit of the complementary column address indicates the logic low level.

44. A semiconductor memory device as claimed in claim 43, wherein said first switching means is a first N-channel MOS transistor having a first drain electrode as the first primary main electrode, a first gate electrode as the first control electrode, and a first source electrode as the first subsidiary main electrode, said second switching means being a second N-channel MOS transistor having a second drain electrode as the second primary main electrode, a second gate electrode as the second control electrode, and a second source electrode as the second subsidiary main electrode, said third switching means being a third N-channel MOS transistor having a third drain electrode as the third primary main electrode, a third gate electrode as the third control electrode, and a third source electrode as the first subsidiary main electrode, said fourth switching means being a fourth N-channel MOS transistor having a fourth drain electrode as the fourth primary main electrode, a fourth gate electrode as the fourth control electrode, and a fourth source electrode as the fourth subsidiary main electrode.

45. A semiconductor memory device as claimed in claim 42, wherein said q-th fuse circuit further comprises:

an N-channel MOS transistor having a drain electrode connected to another end of said q-th bit fuse-element and a source electrode supplied with the low-level potential;

a first inverter having an input terminal connected to the other end of the said test fuse-element and the drain electrode of said N-channel MOS transistor, said first inverter having an output terminal connected to a gate electrode of said N-channel MOS transistor, said first inverter producing the q-th bit fuse output signal; and a second inverter having an input terminal connected to the output terminal of said first inverter, said second inverter inverting the q-th bit fuse output signal to produce the q-th complementary bit fuse output signal.

46. A semiconductor memory device as claimed in claim 36, said decode inhibit signal producing means being an OR gate for producing the decode inhibit signal indicative of active at a logic high level, said p-th redundant decoding circuit producing the p-th redundant decoded signal via an AND circuit, wherein said p-th redundant decoding circuit comprising a test redundant decoding circuit supplied with the test mode signal indicative of active at a logic low level, said test redundant decoding circuit comprising a test fuse circuit including a test fuse-element having an end supplied with a high-level potential, said test fuse circuit producing a test fuse output signal indicative of active at the logic high level when the test fuse-element is not fused, said test redundant decoding circuit supplying said AND circuit with a test redundant decoded signal indicative of active at the logic high level.

47. A semiconductor memory device as claimed in claim 46, wherein said test redundant decoding circuit further comprising combining means, connected to said test fuse circuit and supplied with the test mode signal, for combining the test fuse output signal with the test mode signal to produce a combined signal as the test redundant decoded signal.

48. A semiconductor memory device as claimed in claim 47, wherein said combining means is a NAND circuit for computes the NAND of the test fuse output signal with the test mode signal to produce a NANDed signal as the combined signal.

49. A semiconductor memory device as claimed in claim 46, wherein said test fuse circuit further comprises:

an N-channel MOS transistor having a drain electrode connected to another end of said test fuse-element and a source electrode supplied with the low-level potential;

a first inverter having an input terminal connected to the other end of the said test fuse-element and the drain electrode of said N-channel MOS transistor, said first inverter having an output terminal connected to a gate electrode of said N-channel MOS transistor; and a second inverter having an input terminal connected to the output terminal of said first inverter, said second inverter inverting an output signal of said first inverter to produce the test fuse output signal.

50. A semiconductor memory device as claimed in claim 46, the column address consisting of first through Q-th bits while the complementary column address consists of first through Q-th complementary bits where Q represents a fourth positive integer which is not less than two, said third positive integer P being not more than $2^Q$, wherein said p-th redundant decoding circuit further comprises:

first through Q-th bit redundant decoding circuits connected to input terminals of the AND circuit, a q-th bit redundant decoding circuit being supplied with a q-th bit of the column address and a q-th complementary bit of the complementary column address, where q represents each of 1 through Q, said q-th bit redundant decoding circuit comprising a q-th fuse circuit including a q-th bit fuse-element having an end supplied with the high-level potential, said q-th fuse circuit producing a q-th bit fuse output signal indicative of inactive at the logic low level and a q-th complementary bit fuse output signal indicative of active at the logic high level when said q-th bit fuse-element is not fused, said q-th bit redundant decoding circuit having a q-th bit redundant output node for supplying said AND circuit with a q-th bit redundant decoded signal indicative of active at the logic high level.

51. A semiconductor memory device as claimed in claim 50, wherein said q-th bit redundant decoding circuit further comprises:

first switching means having a first primary main electrode connected to the q-th bit redundant output node, a first control electrode supplied with the q-th complementary bit fuse output signal, and a first subsidiary main electrode supplied with one of the q-th bit of the column address and the q-th complementary bit of the complementary column address, said first switching means being turned on in response to the q-th complementary bit fuse output signal indicative of active; and second switching means having a second primary main electrode connected to the q-th bit redundant output node, a second control electrode supplied with the q-th bit fuse output signal, and a second subsidiary main electrode supplied with another of the q-th bit of the column address and the q-th complementary bit of the complementary column address, said second switching means being turned off in response to the q-th bit fuse output signal indicative of inactive.

52. A semiconductor memory device as claimed in claim 51, wherein said first switching means is a first N-channel MOS transistor having a first drain electrode as the first primary main electrode, a first gate electrode as the first control electrode, and a first source electrode as the first subsidiary main electrode, and said second switching means being a second N-channel MOS transistor having a second drain electrode as the second primary main electrode, a second gate electrode as the second control electrode, and a second source electrode as the second subsidiary main electrode.

53. A semiconductor memory device as claimed in claim 50, wherein said q-th fuse circuit further comprises:

an N-channel MOS transistor having a drain electrode connected to another end of said q-th bit fuse-element and a source electrode supplied with the low-level potential;

a first inverter having an input terminal connected to the other end of the said test fuse-element and the drain electrode of said N-channel MOS transistor, said first inverter having an output terminal connected to a gate electrode of said N-channel MOS transistor, said first inverter producing the q-th bit fuse output signal; and a second inverter having an input terminal connected to the output terminal of said first inverter, said second inverter inverting the q-th bit fuse output signal to produce the q-th complementary bit fuse output signal.

54. A semiconductor memory device as claimed in claim 36, said decode inhibit signal producing means being an AND gate for producing the decode inhibit signal indicative of active at a logic low level, said p-th redundant decoding circuit producing the p-th redundant decoded signal via a p-th redundant decoded signal line, wherein said p-th redundant decoding circuit comprising:

discharging means for discharging the p-th redundant decoded signal line with a low-level potential on carrying out a test of the p-th column of said redundant memory cell array before replacement; and a test redundant decoding circuit supplied with the test mode signal indicative of active at a logic high level, said test redundant decoding circuit comprising a test fuse circuit including a test fuse-element having an end supplied with the low-level potential, said test fuse circuit producing a test fuse output signal indicative of active at the logic low level when the test fuse-element is not fused.

55. A semiconductor memory device as claimed in claim 54, wherein said discharging means is an N-channel MOS transistor having a source electrode supplied with the low-level potential, a drain electrode connected to the p-th redundant decoded signal line, and a gate electrode supplied with a control signal indicative of active at the logic high level.

56. A semiconductor memory device as claimed in claim 54, wherein said test redundant decoding circuit further comprising:

first switching means having a first primary main electrode connected to the p-th redundant decoded signal line, a first control electrode supplied with the test fuse output signal, and a first subsidiary main electrode, said first switching means being turned on in response to the test fuse output signal indicative of active; and second switching means having a second primary main electrode connected to the first subsidiary main electrode of said first switching means, a second control electrode supplied with the test mode signal, and a second subsidiary main electrode supplied with the high-level potential, said second switching means being turned on in response to the test mode signal indicative of inactive.

57. A semiconductor memory device as claimed in claim 56, wherein said first switching means is a first P-channel MOS transistor having a first drain electrode as the first primary main electrode, a first gate electrode as the first control electrode, and a first source electrode as the first subsidiary main electrode, said second switching means is a second P-channel MOS transistor having a second drain electrode as the second primary main electrode, a second gate electrode as the second control electrode, and a second source electrode as the second subsidiary main electrode.

58. A semiconductor memory device as claimed in claim 54, wherein said test fuse circuit further comprises:

a P-channel MOS transistor having a drain electrode connected to another end of said test fuse-element and a source electrode supplied with the high-level potential;

a first inverter having an input terminal connected to the other end of the said test fuse-element and the drain electrode of said P-channel MOS transistor, said first inverter having an output terminal connected to a gate electrode of said P-channel MOS transistor; and a second inverter having an input terminal connected to the output terminal of said first inverter, said second inverter inverting an output signal of said first inverter to produce the test fuse output signal.

59. A semiconductor memory device as claimed in claim 54, the column address consisting of first through Q-th bits while the complementary column address consists of first through Q-th complementary bits where Q represents a fourth positive integer which is not less than two, said third positive integer P being not more than $2^Q$, wherein said p-th redundant decoding circuit further comprises:

first through Q-th bit redundant decoding circuits connected to the p-th redundant decoded signal line, a q-th bit redundant decoding circuit being supplied with a q-th bit of the column address and a q-th complementary bit of the complementary column address, where q represents each of 1 through Q, said q-th bit redundant decoding circuit comprising a q-th fuse circuit including a q-th bit fuse-element having an end supplied with the low-level potential, said q-th fuse circuit producing a q-th bit fuse output signal indicative of inactive at the logic high level and a q-th complementary bit fuse output signal indicative of active at the logic low level when said q-th bit fuse-element is not fused.

60. A semiconductor memory device as claimed in claim 59, wherein said q-th bit redundant decoding circuit further comprises:

first switching means having a first primary main electrode connected to the p-th redundant decoded signal line, a first control electrode supplied with the q-th bit fuse output signal, and a first subsidiary main electrode, said first switching means being turned off in response to the q-th bit fuse output signal indicative of inactive, second switching means having a second primary main electrode connected to the first subsidiary main electrode of said first switching means, a second control electrode supplied with one of the q-th bit of the column address and the q-th complementary bit of the complementary column address, and a second subsidiary main electrode supplied with the high-level potential, said second switching means being turned on when said one of the q-th bit of the column address and the q-th complementary bit of the complementary column address indicates the logic low level;

third switching means having a third primary main electrode connected to the p-th redundant decoded signal line a third control electrode supplied with the q-th complementary bit fuse output signal, and a third subsidiary main electrode, said third switching means being turned on in response to the q-th complementary bit fuse output signal indicative of active; and fourth switching means having a fourth primary main electrode connected to the third subsidiary main electrode of said third switching means, a fourth control electrode supplied with another of the q-th bit of the column address and the q-th complementary bit of the complementary column address, and a fourth subsidiary main electrode supplied with the high-level potential, said fourth switching means being turned off when said other of the q-th bit of the column address and the q-th complementary bit of the complementary column address indicates the logic high level.

61. A semiconductor memory device as claimed in claim 60, wherein said first switching means is a first P-channel MOS transistor having a first drain electrode as the first primary main electrode, a first gate electrode as the first control electrode, and a first source electrode as the first subsidiary main electrode, said second switching means being a second P-channel MOS transistor having a second drain electrode as the second primary main electrode, a second gate electrode as the second control electrode, and a second source electrode as the second subsidiary main electrode, said third switching means being a third P-channel MOS transistor having a third drain electrode as the third primary main electrode, a third gate electrode as the third control electrode, and a third source electrode as the first subsidiary main electrode, said fourth switching means being a fourth P-channel MOS transistor having a fourth drain electrode as the fourth primary main electrode, a fourth gate electrode as the fourth control electrode, and a fourth source electrode as the fourth subsidiary main electrode.

62. A semiconductor memory device as claimed in claim 59, wherein said q-th fuse circuit further comprises:

a P-channel MOS transistor having a drain electrode connected to another end of said q-th bit fuse-element and a source electrode supplied with the high-level potential;

a first inverter having an input terminal connected to the other end of the said test fuse-element and the drain electrode of said P-channel MOS transistor, said first inverter having an output terminal connected to a gate electrode of said P-channel MOS transistor, said first inverter producing the q-th bit fuse output signal; and a second inverter having an input terminal connected to the output terminal of said first inverter, said second inverter inverting the q-th bit fuse output signal to produce the q-th complementary bit fuse output signal.

63. A semiconductor memory device as claimed in claim 36, said decode inhibit signal producing means being an AND gate for producing the decode inhibit signal indicative of active at a logic low level, said p-th redundant decoding circuit producing the p-th redundant decoded signal via an OR circuit, wherein said p-th redundant decoding circuit comprising a test redundant decoding circuit supplied with the test mode signal indicative of active at a logic high level, said test redundant decoding circuit comprising a test fuse circuit including a test fuse-element having an end supplied with a low-level potential, said test fuse circuit producing a test fuse output signal indicative of active at the logic low level when the test fuse-element is not fused, said test redundant decoding circuit supplying said AND circuit with a test redundant decoded signal indicative of active at the logic low level.

64. A semiconductor memory device as claimed in claim 63, wherein said test redundant decoding circuit further comprising combining means, connected to said test fuse circuit and supplied with the test mode signal, for combining the test fuse output signal with the test mode signal to produce a combined signal as the test redundant decoded signal.

65. A semiconductor memory device as claimed in claim 64, wherein said combining means is a NOR circuit for computes the NOR of the test fuse output signal with the test mode signal to produce a NORed signal as the combined signal.

66. A semiconductor memory device as claimed in claim 63, wherein said test fuse circuit further comprises:

a P-channel MOS transistor having a drain electrode connected to another end of said test fuse-element and a source electrode supplied with the high-level potential;

a first inverter having an input terminal connected to the other end of the said test fuse-element and the drain electrode of said P-channel MOS transistor, said first inverter having an output terminal connected to a gate electrode of said P-channel MOS transistor; and a second inverter having an input terminal connected to the output terminal of said first inverter, said second inverter inverting an output signal of said first inverter to produce the test fuse output signal.

67. A semiconductor memory device as claimed in claim 63, the column address consisting of first through Q-th bits while the complementary column address consists of first through Q-th complementary bits where Q represents a fourth positive integer which is not less than two, said third positive integer P being not more than $2^Q$, wherein said p-th redundant decoding circuit further comprises:

first through Q-th bit redundant decoding circuits connected to input terminals of the OR circuit, a q-th bit redundant decoding circuit being supplied with a q-th bit of the column address and a q-th complementary bit of the complementary column address, where q represents each of 1 through Q, said q-th bit redundant decoding circuit comprising a q-th fuse circuit including a q-th bit fuse-element having an end supplied with the low-level potential, said q-th fuse circuit producing a q-th bit fuse output signal indicative of inactive at the logic high level and a q-th complementary bit fuse output signal indicative of active at the logic low level when said q-th bit fuse-element is not fused, said q-th bit redundant decoding circuit having a q-th bit redundant output node for supplying said OR circuit with a q-th bit redundant decoded signal indicative of active at the logic low level.

68. A semiconductor memory device as claimed in claim 67, wherein said q-th bit redundant decoding circuit further comprises:

first switching means having a first primary main electrode connected to the q-th bit redundant output node, a first control electrode supplied with the q-th complementary bit fuse output signal, and a first subsidiary main electrode supplied with one of the q-th bit of the column address and the q-th complementary bit of the complementary column address, said first switching means being turned on in response to the q-th complementary bit fuse output signal indicative of active; and second switching means having a second primary main electrode connected to the q-th bit redundant output node, a second control electrode supplied with the q-th bit fuse output signal, and a second subsidiary main electrode supplied with another of the q-th bit of the column address and the q-th complementary bit of the complementary column address, said second switching means being turned off in response to the q-th bit fuse output signal indicative of inactive.

69. A semiconductor memory device as claimed in claim 68, wherein said first switching means is a first P-channel MOS transistor having a first drain electrode as the first primary main electrode, a first gate electrode as the first control electrode, and a first source electrode as the first subsidiary main electrode, and said second switching means being a second P-channel MOS transistor having a second drain electrode as the second primary main electrode, a second gate electrode as the second control electrode, and a second source electrode as the second subsidiary main electrode.

70. A semiconductor memory device as claimed in claim 67, wherein said q-th fuse circuit further comprises:

a P-channel MOS transistor having a drain electrode connected to another end of said q-th bit fuse-element and a source electrode supplied with the high-level potential;

a first inverter having an input terminal connected to the other end of the said test fuse-element and the drain electrode of said N-channel MOS transistor, said first inverter having an output terminal connected to a gate electrode of said P-channel MOS transistor, said first inverter producing the q-th bit fuse output signal; and a second inverter having an input terminal connected to the output terminal of said first inverter, said second inverter inverting the q-th bit fuse output signal to produce the q-th complementary bit fuse output signal.

71. A semiconductor memory device comprising:

a regular memory cell array comprising a plurality of regular memory cells;

a regular decoder, connected to said regular memory cell array and supplied with a decode inhibit signal, an address signal, and a complementary address signal having a logical value which is reverse of that of the address signal, for decoding the address signal and the complementary address signal into a regular decoded signal for activating one of the regular memory cells when the decode inhibit signal is indicative of inactive;

a redundant memory cell array comprising a plurality of redundant memory cells, each of the redundant memory cells of said redundant memory cell array carrying out a substitute operation by replacing a defective one of the regular memory cells of said regular memory cell array that is diagnosed as a defective memory cell; and a redundant decoder connected said redundant memory cell and said regular decoder and supplied with a test mode signal, said redundant decoder comprising a plurality of redundant decoding circuits connected to the respective redundant memory cells of said redundant memory cell array, each of said redundant decoding circuits being supplied with the address signal, the complementary address signal, and the test mode signal, each redundant decoding circuit being set with a redundant address which is identical with an address for the defective memory cell of said regular memory cell array, each redundant decoding circuit supplying a corresponding redundant memory cell of said redundant memory cell array with a redundant decoded signal for activating the corresponding redundant memory cell of said redundant memory cell array when said redundant decoding circuit is supplied with the address signal and the complementary address signal which are indicative of the redundant address for said redundant decoding circuit in question, said redundant decoding circuits being supplied with the address signal and the complementary address signal in different order so that at least one pair of a bit in the address signal and a corresponding bit in the complementary address signal is supplied in the reverse sequence, said redundant decoder further comprising a decode inhibit signal producing means, connected between said first through said P-th redundant decoding circuits and said regular decoder, for producing the decode inhibit signal indicative of active when any one of the redundant decoded signals is indicative of active.

72. A semiconductor memory device as claimed in claim 71, said decode inhibit signal producing means being an OR gate for producing the decode inhibit signal indicative of active at a logic high level, said redundant decoding circuit producing the redundant decoded signal via a redundant decoded signal line, wherein said redundant decoding circuit comprising:

charging means for charging the redundant decoded signal line with a high-level potential on carrying out a test of the corresponding redundant memory cell of said redundant memory cell array before replacement; and a test redundant decoding circuit supplied with the test mode signal indicative of active at a logic low level, said test redundant decoding circuit comprising a test fuse circuit including a test fuse-element having an end supplied with the high-level potential, said test fuse circuit producing a test fuse output signal indicative of active at the logic high level when the test fuse-element is not fused.

73. A semiconductor memory device as claimed in claim 72, wherein said charging means is a P-channel MOS transistor having a source electrode supplied with the high-level potential, a drain electrode connected to the redundant decoded signal line, and a gate electrode supplied with a control signal indicative of active at the logic low level.

74. A semiconductor memory device as claimed in claim 72, wherein said test redundant decoding circuit further comprising:

first switching means having a first primary main electrode connected to the redundant decoded signal line, a first control electrode supplied with the test fuse output signal, and a first subsidiary main electrode, said first switching means being turned on in response to the test fuse output signal indicative of active; and second switching means having a second primary main electrode connected to the first subsidiary main electrode of said first switching means, a second control electrode supplied with the test mode signal, and a second subsidiary main electrode supplied with the low-level potential, said second switching means being turned on in response to the test mode signal indicative of inactive.

75. A semiconductor memory device as claimed in claim 74, wherein said first switching means is a first N-channel MOS transistor having a first drain electrode as the first primary main electrode, a first gate electrode as the first control electrode, and a first source electrode as the first subsidiary main electrode, said second switching means is a second N-channel MOS transistor having a second drain electrode as the second primary main electrode, a second gate electrode as the second control electrode, and a second source electrode as the second subsidiary main electrode.

76. A semiconductor memory device as claimed in claim 72, wherein said test fuse circuit further comprises:

an N-channel MOS transistor having a drain electrode connected to another end of said test fuse-element and a source electrode supplied with the low-level potential;

a first inverter having an input terminal connected to the other end of the said test fuse-element and the drain electrode of said N-channel MOS transistor, said first inverter having an output terminal connected to a gate electrode of said N-channel MOS transistor; and a second inverter having an input terminal connected to the output terminal of said first inverter, said second inverter inverting an output signal of said first inverter to produce the test fuse output signal.

77. A semiconductor memory device as claimed in claim 72, the address signal consisting of first through Q-th bits while the complementary address signal consists of first through Q-th complementary bits where Q represents a positive integer which is not less than two, wherein said redundant decoding circuit further comprises:

first through Q-th bit redundant decoding circuits connected to the redundant decoded signal line, a q-th bit redundant decoding circuit being supplied with a q-th bit of the address signal and a q-th complementary bit of the complementary address signal, where q represents each of 1 through Q, said q-th bit redundant decoding circuit comprising a q-th fuse circuit including a q-th bit fuse-element having an end supplied with the high-level potential, said q-th fuse circuit producing a q-th bit fuse output signal indicative of inactive at the logic low level and a q-th complementary bit fuse output signal indicative of active at the logic high level when said q-th bit fuse-element is not fused.

78. A semiconductor memory device as claimed in claim 77, wherein said q-th bit redundant decoding circuit further comprises:

first switching means having a first primary main electrode connected to the redundant decoded signal line, a first control electrode supplied with the q-th bit fuse output signal, and a first subsidiary main electrode, said first switching means being turned off in response to the q-th bit fuse output signal indicative of inactive;

second switching means having a second primary main electrode connected to the first subsidiary main electrode of said first switching means, a second control electrode supplied with one of the q-th bit of the address signal and the q-th complementary bit of the complementary address signal, and a second subsidiary main electrode supplied with the low-level potential, said second switching means being turned on when said one of the q-th bit of the address signal and the q-th complementary bit of the complementary address signal indicates the logic high level;

third switching means having a third primary main electrode connected to the redundant decoded signal line, a third control electrode supplied with the q-th complementary bit fuse output signal, and a third subsidiary main electrode, said third switching means being turned on in response to the q-th complementary bit fuse output signal indicative of active; and fourth switching means having a fourth primary main electrode connected to the third subsidiary main electrode of said third switching means, a fourth control electrode supplied with another of the q-th bit of the address signal and the q-th complementary bit of the complementary address signal, and a fourth subsidiary main electrode supplied with the low-level potential, said fourth switching means being turned off when said other of the q-th bit of the address signal and the q-th complementary bit of the complementary address signal indicates the logic low level.

79. A semiconductor memory device as claimed in claim 78, wherein said first switching means is a first N-channel MOS transistor having a first drain electrode as the first primary main electrode, a first gate electrode as the first control electrode, and a first source electrode as the first subsidiary main electrode, said second switching means being a second N-channel MOS transistor having a second drain electrode as the second primary main electrode, a second gate electrode as the second control electrode, and a second source electrode as the second subsidiary main electrode, said third switching means being a third N-channel MOS transistor having a third drain electrode as the third primary main electrode, a third gate electrode as the third control electrode, and a third source electrode as the first subsidiary main electrode, said fourth switching means being a fourth N-channel MOS transistor having a fourth drain electrode as the fourth primary main electrode, a fourth gate electrode as the fourth control electrode, and a fourth source electrode as the fourth subsidiary main electrode.

80. A semiconductor memory device as claimed in claim 77, wherein said q-th fuse circuit further comprises:
- an N-channel MOS transistor having a drain electrode connected to another end of said q-th bit fuse-element and a source electrode supplied with the low-level potential;
- a first inverter having an input terminal connected to the other end of the said test fuse-element and the drain electrode of said N-channel MOS transistor, said first inverter having an output terminal connected to a gate electrode of said N-channel MOS transistor, said first inverter producing the q-th bit fuse output signal; and
- a second inverter having an input terminal connected to the output terminal of said first inverter, said second inverter inverting the q-th bit fuse output signal to produce the q-th complementary bit fuse output signal.

81. A semiconductor memory device as claimed in claim 71, said decode inhibit signal producing means being an OR gate for producing the decode inhibit signal indicative of active at a logic high level, said redundant decoding circuit producing the redundant decoded signal via an AND circuit, wherein said redundant decoding circuit comprising a test redundant decoding circuit supplied with the test mode signal indicative of active at a logic low level, said test redundant decoding circuit comprising a test fuse circuit including a test fuse-element having an end supplied with a high-level potential, said test fuse circuit producing a test fuse output signal indicative of active at the logic high level when the test fuse-element is not fused, said test redundant decoding circuit supplying said AND circuit with a test redundant decoded signal indicative of active at the logic high level.

82. A semiconductor memory device as claimed in claim 81, wherein said test redundant decoding circuit further comprising combining means, connected to said test fuse circuit and supplied with the test mode signal, for combining the test fuse output signal with the test mode signal to produce a combined signal as the test redundant decoded signal.

83. A semiconductor memory device as claimed in claim 82, wherein said combining means is a NAND circuit for computes the NAND of the test fuse output signal with the test mode signal to produce a NANDed signal as the combined signal.

84. A semiconductor memory device as claimed in claim 81, wherein said test fuse circuit further comprises:
- an N-channel MOS transistor having a drain electrode connected to another end of said test fuse-element and a source electrode supplied with the low-level potential;
- a first inverter having an input terminal connected to the other end of the said test fuse-element and the drain electrode of said N-channel MOS transistor, said first inverter having an output terminal connected to a gate electrode of said N-channel MOS transistor; and
- a second inverter having an input terminal connected to the output terminal of said first inverter, said second inverter inverting an output signal of said first inverter to produce the test fuse output signal.

85. A semiconductor memory device as claimed in claim 81, the address signal consisting of first through Q-th bits while the complementary address signal consists of first through Q-th complementary bits where Q represents a positive integer which is not less than two, wherein said redundant decoding circuit further comprises:
- first through Q-th bit redundant decoding circuits connected to input terminals of the AND circuit, a q-th bit redundant decoding circuit being supplied with a q-th bit of the address signal and a q-th complementary bit of the complementary address signal, where q represents each of 1 through Q, said q-th bit redundant decoding circuit comprising a q-th fuse circuit including a q-th bit fuse-element having an end supplied with the high-level potential, said q-th fuse circuit producing a q-th bit fuse output signal indicative of inactive at the logic low level and a q-th complementary bit fuse output signal indicative of active at the logic high level when said q-th bit fuse-element is not fused, said q-th bit redundant decoding circuit having a q-th bit redundant output node for supplying said AND circuit with a q-th bit redundant decoded signal indicative of active at the logic high level.

86. A semiconductor memory device as claimed in claim 85, wherein said q-th bit redundant decoding circuit further comprises:
- first switching means having a first primary main electrode connected to the q-th bit redundant output node, a first control electrode supplied with the q-th complementary bit fuse output signal, and a first subsidiary main electrode supplied with one of the q-th bit of the address signal and the q-th complementary bit of the complementary address signal, said first switching means being turned on in response to the q-th complementary bit fuse output signal indicative of active; and
- second switching means having a second primary main electrode connected to the q-th bit redundant output node, a second control electrode supplied with the q-th bit fuse output signal, and a second subsidiary main electrode supplied with another of the q-th bit of the address signal and the q-th complementary bit of the complementary address signal, said second switching means being turned off in response to the q-th bit fuse output signal indicative of inactive.

87. A semiconductor memory device as claimed in claim 86, wherein said first switching means is a first N-channel MOS transistor having a first drain electrode as the first primary main electrode, a first gate electrode as the first control electrode, and a first source electrode as the first subsidiary main electrode, and said second switching means being a second N-channel MOS transistor having a second drain electrode as the second primary main electrode, a second gate electrode as the second control electrode, and a second source electrode as the second subsidiary main electrode.

88. A semiconductor memory device as claimed in claim 85, wherein said q-th fuse circuit further comprises:
- an N-channel MOS transistor having a drain electrode connected to another end of said q-th bit fuse-element and a source electrode supplied with the low-level potential;
- a first inverter having an input terminal connected to the other end of the said test fuse-element and the drain electrode of said N-channel MOS transistor, said first inverter having an output terminal connected to a gate electrode of said N-channel MOS transistor, said first inverter producing the q-th bit fuse output signal; and a second inverter having an input terminal connected to the output terminal of said first inverter, said second inverter inverting the q-th bit fuse output signal to produce the q-th complementary bit fuse output signal.

89. A semiconductor memory device as claimed in claim 71, said decode inhibit signal producing means being an AND gate for producing the decode inhibit signal indicative of active at a logic low level, said redundant decoding circuit producing the redundant decoded signal via a redundant decoded signal line, wherein said redundant decoding circuit comprising:

discharging means for discharging the redundant decoded signal line with a low-level potential on carrying out a test of the corresponding redundant memory cell of said redundant memory cell array before replacement; and a test redundant decoding circuit supplied with the test mode signal indicative of active at a logic high level, said test redundant decoding circuit comprising a test fuse circuit including a test fuse-element having an end supplied with the low-level potential, said test fuse circuit producing a test fuse output signal indicative of active at the logic low level when the test fuse-element is not fused.

90. A semiconductor memory device as claimed in claim 89, wherein said discharging means is an N-channel MOS transistor having a source electrode supplied with the low-level potential, a drain electrode connected to the redundant decoded signal line, and a gate electrode supplied with a control signal indicative of active at the logic high level.

91. A semiconductor memory device as claimed in claim 89, wherein said test redundant decoding circuit further comprising:

first switching means having a first primary main electrode connected to the redundant decoded signal line, a first control electrode supplied with the test fuse output signal, and a first subsidiary main electrode, said first switching means being turned on in response to the test fuse output signal indicative of active; and second switching means having a second primary main electrode connected to the first subsidiary main electrode of said first switching means, a second control electrode supplied with the test mode signal, and a second subsidiary main electrode supplied with the high-level potential, said second switching means being turned on in response to the test mode signal indicative of inactive.

92. A semiconductor memory device as claimed in claim 91, wherein said first switching means is a first P-channel MOS transistor having a first drain electrode as the first primary main electrode, a first gate electrode as the first control electrode, and a first source electrode as the first subsidiary main electrode, said second switching means is a second P-channel MOS transistor having a second drain electrode as the second primary main electrode, a second gate electrode as the second control electrode, and a second source electrode as the second subsidiary main electrode.

93. A semiconductor memory device as claimed in claim 89, wherein said test fuse circuit further comprises:

a P-channel MOS transistor having a drain electrode connected to another end of said test fuse-element and a source electrode supplied with the high-level potential;

a first inverter having an input terminal connected to the other end of the said test fuse-element and the drain electrode of said P-channel MOS transistor, said first inverter having an output terminal connected to a gate electrode of said P-channel MOS transistor; and a second inverter having an input terminal connected to the output terminal of said first inverter, said second inverter inverting an output signal of said first inverter to produce the test fuse output signal.

94. A semiconductor memory device as claimed in claim 89, the address signal consisting of first through Q-th bits while the complementary address signal consists of first through Q-th complementary bits where Q represents a positive integer which is not less than two, wherein said redundant decoding circuit further comprises:

first through Q-th bit redundant decoding circuits connected to the redundant decoded signal line, a q-th bit redundant decoding circuit being supplied with a q-th bit of the address signal and a q-th complementary bit of the complementary address signal, where q represents each of 1 through Q, said q-th bit redundant decoding circuit comprising a q-th fuse circuit including a q-th bit fuse-element having an end supplied with the low-level potential, said q-th fuse circuit producing a q-th bit fuse output signal indicative of inactive at the logic high level and a q-th complementary bit fuse output signal indicative of active at the logic low level when said q-th bit fuse-element is not fused.

95. A semiconductor memory device as claimed in claim 94, wherein said q-th bit redundant decoding circuit further comprises:

first switching means having a first primary main electrode connected to the redundant decoded signal line, a first control electrode supplied with the q-th bit fuse output signal, and a first subsidiary main electrode, said first switching means being turned off in response to the q-th bit fuse output signal indicative of inactive;

second switching means having a second primary main electrode connected to the first subsidiary main electrode of said first switching means, a second control electrode supplied with one of the q-th bit of the address signal and the q-th complementary bit of the complementary address signal, and a second subsidiary main electrode supplied with the high-level potential said second switching means being turned on when said one of the q-th bit of the address signal and the q-th complementary bit of the complementary address signal indicates the logic low level;

third switching means having a third primary main electrode connected to the p-th redundant decoded signal line a third control electrode supplied with the q-th complementary bit fuse output signal, and a third subsidiary main electrode, said third switching means being turned on in response to the q-th complementary bit fuse output signal indicative of active; and fourth switching means having a fourth primary main electrode connected to the third subsidiary main electrode of said third switching means, a fourth control electrode supplied with another of the q-th bit of the address signal and the q-th complementary bit of the complementary address signal, and a fourth subsidiary main electrode supplied with the high-level potential, said fourth switching means being turned off when said other of the q-th bit of the address signal and the q-th complementary bit of the complementary address signal indicates the logic high level.

96. A semiconductor memory device as claimed in claim 95, wherein said first switching means is a first P-channel MOS transistor having a first drain electrode as the first primary main electrode, a first gate electrode as the first control electrode, and a first source electrode as the first subsidiary main electrode, said second switching means being a second P-channel MOS transistor having a second drain electrode as the second primary main electrode, a second gate electrode as the second control electrode, and a second source electrode as the second subsidiary main electrode, said third switching means being a third P-channel MOS transistor having a third drain electrode as the third primary main electrode, a third gate electrode as the third control electrode, and a third source electrode as the first subsidiary main electrode, said fourth switching means being a fourth P-channel MOS transistor having a fourth drain electrode as the fourth primary main electrode, a fourth gate electrode as the fourth control electrode, and a fourth source electrode as the fourth subsidiary main electrode.

97. A semiconductor memory device as claimed in claim 94, wherein said q-th fuse circuit further comprises:

a P-channel MOS transistor having a drain electrode connected to another end of said q-th bit fuse-element and a source electrode supplied with the high-level potential;

a first inverter having an input terminal connected to the other end of the said test fuse-element and the drain electrode of said P-channel MOS transistor, said first inverter having an output terminal connected to a gate electrode of said P-channel MOS transistor, said first inverter producing the q-th bit fuse output signal; and a second inverter having an input terminal connected to the output terminal of said first inverter, said second inverter inverting the q-th bit fuse output signal to produce the q-th complementary bit fuse output signal.

98. A semiconductor memory device as claimed in claim 71, said decode inhibit signal producing means being an AND gate for producing the decode inhibit signal indicative of active at a logic low level, said redundant decoding circuit producing the redundant decoded signal via an OR circuit, wherein said redundant decoding circuit comprising a test redundant decoding circuit supplied with the test mode signal indicative of active at a logic high level, said test redundant decoding circuit comprising a test fuse circuit including a test fuse-element having an end supplied with a low-level potential, said test fuse circuit producing a test fuse output signal indicative of active at the logic low level when the test fuse-element is not fused, said test redundant decoding circuit supplying said AND circuit with a test redundant decoded signal indicative of active at the logic low level.

99. A semiconductor memory device as claimed in claim 98, wherein said test redundant decoding circuit further comprising combining means, connected to said test fuse circuit and supplied with the test mode signal, for combining the test fuse output signal with the test mode signal to produce a combined signal as the test redundant decoded signal.

100. A semiconductor memory device as claimed in claim 99, wherein said combining means is a NOR circuit for computes the NOR of the test fuse output signal with the test mode signal to produce a NORed signal as the combined signal.

101. A semiconductor memory device as claimed in claim 98, wherein said test fuse circuit further comprises:

a P-channel MOS transistor having a drain electrode connected to another end of said test fuse-element and a source electrode supplied with the high-level potential;

a first inverter having an input terminal connected to the other end of the said test fuse-element and the drain electrode of said P-channel MOS transistor, said first inverter having an output terminal connected to a gate electrode of said P-channel MOS transistor; and a second inverter having an input terminal connected to the output terminal of said first inverter, said second inverter inverting an output signal of said first inverter to produce the test fuse output signal.

102. A semiconductor memory device as claimed in claim 98, the address signal consisting of first through Q-th bits while the complementary address signal consists of first through Q-th complementary bits where Q represents a positive integer which is not less than two, wherein said redundant decoding circuit further comprises:

first through Q-th bit redundant decoding circuits connected to input terminals of the OR circuit, a q-th bit redundant decoding circuit being supplied with a q-th bit of the address signal and a q-th complementary bit of the complementary address signal, where q represents each of 1 through Q, said q-th bit redundant decoding circuit comprising a q-th fuse circuit including a q-th bit fuse-element having an end supplied with the low-level potential, said q-th fuse circuit producing a q-th bit fuse output signal indicative of inactive at the logic high level and a q-th complementary bit fuse output signal indicative of active at the logic low level when said q-th bit fuse-element is not fused, said q-th bit redundant decoding circuit having a q-th bit redundant output node for supplying said OR circuit with a q-th bit redundant decoded signal indicative of active at the logic low level.

103. A semiconductor memory device as claimed in claim 102, wherein said q-th bit redundant decoding circuit further comprises:

first switching means having a first primary main electrode connected to the q-th bit redundant output node, a first control electrode supplied with the q-th complementary bit fuse output signal, and a first subsidiary main electrode supplied with one of the q-th bit of the address signal and the q-th complementary bit of the complementary address signal, said first switching means being turned on in response to the q-th complementary bit fuse output signal indicative of active; and second switching means having a second primary main electrode connected to the q-th bit redundant output node, a second control electrode supplied with the q-th bit fuse output signal, and a second subsidiary main electrode supplied with another of the q-th bit of the address signal and the q-th complementary bit of the complementary address signal, said second switching means being turned off in response to the q-th bit fuse output signal indicative of inactive.

104. A semiconductor memory device as claimed in claim 103, wherein said first switching means is a first P-channel MOS transistor having a first drain electrode as the first primary main electrode, a first gate electrode as the first control electrode, and a first source electrode as the first subsidiary main electrode, and said second switching means being a second P-channel MOS transistor having a second drain electrode as the second primary main electrode, a second gate electrode as the second control electrode, and a second source electrode as the second subsidiary main electrode.

105. A semiconductor memory device as claimed in claim 102, wherein said q-th fuse circuit further comprises:

a P-channel MOS transistor having a drain electrode connected to another end of said q-th bit fuse-element and a source electrode supplied with the high-level potential;

a first inverter having an input terminal connected to the other end of the said test fuse-element and the drain electrode of said N-channel MOS transistor, said first inverter having an output terminal connected to a gate electrode of said P-channel MOS transistor, said first inverter producing the q-th bit fuse output signal; and a second inverter having an input terminal connected to the output terminal of said first inverter, said second inverter inverting the q-th bit fuse output signal to produce the q-th complementary bit fuse output signal.

* * * * *